US012777824B2

(12) United States Patent
Yu et al.

(10) Patent No.: US 12,777,824 B2
(45) Date of Patent: Oct. 27, 2026

(54) DISPLAY PANEL AND DISPLAY DEVICE

(71) Applicants: Chengdu BOE Optoelectronics Technology Co.,Ltd., Sichuan (CN); BOE Technology Group Co., Ltd., Beijing (CN)

(72) Inventors: Chi Yu, Beijing (CN); Bo Shi, Beijing (CN); Qixiao Wu, Beijing (CN); Zhiliang Jiang, Beijing (CN); Ge Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 348 days.

(21) Appl. No.: 18/263,351

(22) PCT Filed: Jun. 21, 2022

(86) PCT No.: PCT/CN2022/100235
§ 371 (c)(1),
(2) Date: Jul. 28, 2023

(87) PCT Pub. No.: WO2023/245447
PCT Pub. Date: Dec. 28, 2023

(65) Prior Publication Data
US 2024/0431184 A1 Dec. 26, 2024

(51) Int. Cl.
*H10K 59/80* (2023.01)
*H10K 59/122* (2023.01)
*H10K 59/131* (2023.01)

(52) U.S. Cl.
CPC ....... *H10K 59/8792* (2023.02); *H10K 59/122* (2023.02); *H10K 59/131* (2023.02)

(58) Field of Classification Search
CPC ............. H10K 59/8792; H10K 59/122; H10K 59/131; H10K 59/00; H10K 59/126; H10K 59/65; H10K 59/80521
See application file for complete search history.

(56) References Cited

U.S. PATENT DOCUMENTS

2021/0202621 A1* 7/2021 Liang .................. H10K 59/124
2021/0408439 A1 12/2021 Wang

FOREIGN PATENT DOCUMENTS

CN 102751310 A 10/2012
CN 107819020 A 3/2018
(Continued)

OTHER PUBLICATIONS

Written Opinion from PCT/CN2022/100235 dated Jan. 18, 2023.
(Continued)

*Primary Examiner* — Elmito Breval
(74) *Attorney, Agent, or Firm* — Calfee, Halter & Griswold LLP

(57) ABSTRACT

A display panel and a display device are provided. The display panel has a main display area and a light-transmitting display area, including: a first electrode layer including multiple first electrodes arranged at intervals; a pixel definition layer is provided with multiple first via holes; a light-emitting layer group is at least partially arranged within the first via holes, and the light-emitting layer group located within the first via holes forms light-emitting parts; in the light-transmitting display area, a second electrode layer includes multiple second electrodes and connection wires connected with each other; the multiple second electrodes are arranged at intervals, the second electrodes are located on a side of the light-emitting parts away from a base substrate, and orthographic projections of the second elec-
(Continued)

trodes on the base substrate cover orthographic projections of the first electrodes on the base substrate.

20 Claims, 15 Drawing Sheets

(56) References Cited

FOREIGN PATENT DOCUMENTS

| | | | |
|---|---|---|---|
| CN | 108493230 | A | 9/2018 |
| CN | 109148718 | A | 1/2019 |
| CN | 109273512 | A | 1/2019 |
| CN | 109755278 | A | 5/2019 |
| CN | 109920826 | A | 6/2019 |
| CN | 110429117 | A | 11/2019 |
| CN | 111029382 | A | 4/2020 |
| CN | 111834538 | A | 10/2020 |
| CN | 112909063 | A | 6/2021 |
| CN | 112928147 | A | 6/2021 |
| CN | 113053978 | A | 6/2021 |
| CN | 111834538 | B | 7/2021 |
| CN | 113725272 | A | 11/2021 |
| CN | 113809134 | A | 12/2021 |
| WO | 2021140535 | A1 | 7/2021 |
| WO | 2021169607 | A1 | 9/2021 |
| WO | 2022170666 | A1 | 8/2022 |
| WO | 2022188234 | A1 | 9/2022 |

OTHER PUBLICATIONS

International Search Report from PCT/CN2022/100235 dated Jan. 18, 2023.

First Office Action of CN application No. 202280001828.1 dated Aug. 11, 2026.

* cited by examiner

21+23+25+24

21+23+25+24+26

21+23+25+24

21+23+25+24+26

DISPLAY PANEL AND DISPLAY DEVICE

CROSS REFERENCE TO RELATED APPLICATION

The present disclosure is the U.S. national phase application of International Application No. PCT/CN2022/100235 filed on Jun. 21, 2022, the content of which is incorporated herein by reference in its entirety for all purposes.

TECHNICAL FIELD

The present disclosure relates to the field of display technology, in particular to a display panel and a display device.

BACKGROUND

With the continuous improvement of consumers' pursuit for sensory aspects of the display panel and the continuous progress of technology in the display panel industry, in order to achieve a high screen ratio and the ultimate visual experience, a portion of the display panel is provided as a light-transmitting display area, and a camera is arranged at a back of the light-transmitting display area.

It should be noted that the information disclosed in above section is only for the purpose of enhancing the understanding of the background of the present disclosure, and thus may include information that does not constitute prior art already known to those of ordinary skill in the art.

SUMMARY

According to one aspect of the present disclosure, a display panel having a main display area and a light-transmitting display area arranged adjacently is provided. The display panel includes: a base substrate; a first electrode layer arranged on a side of the base substrate, wherein the first electrode layer includes multiple first electrodes arranged at intervals; a pixel definition layer arranged on a side of the first electrode layer away from the base substrate, wherein the pixel definition layer is provided with multiple first via holes, and the multiple first via holes are connected to the multiple first electrodes in correspondence; a light-emitting layer group at least partially arranged within the first via holes, wherein the light-emitting layer group located within the first via holes forms light-emitting parts; and a second electrode layer arranged on a side of the light-emitting layer group away from the base substrate, wherein in the light-transmitting display area, the second electrode layer includes: multiple second electrodes arranged at intervals, wherein the second electrodes are located on a side of the light-emitting parts away from the base substrate, orthographic projections of the second electrodes on the base substrate cover orthographic projections of the first electrodes on the base substrate; and multiple connection wires connected between the multiple second electrodes.

In some embodiments, the multiple connection wires are parallel to each other.

In some embodiments, walls of the first via holes are provided in an inclined manner, to increase cross-sectional areas of sections of the first via holes parallel to a first direction as a distance to the base substrate increases along a third direction, and inclination angles of the walls are greater than or equal to 5° and less than or equal to 50°, and wherein the first direction is parallel to a surface of the base substrate close to the first electrode layer, and the third direction is perpendicular to the surface of the base substrate close to the first electrode layer.

In some embodiments, in the light-transmitting display area, the display panel further includes: a first shielding layer arranged on a side of the first electrode layer away from the base substrate, wherein the first shielding layer includes multiple first shielding parts corresponding to the multiple first electrodes, orthographic projections of the first shielding parts on the base substrate overlap with the orthographic projections of the first electrodes on the base substrate, to block reflected light from the first electrodes.

In some embodiments, the pixel definition layer includes multiple pixel definition parts arranged at intervals, the multiple pixel definition parts and the multiple first electrodes are arranged in correspondence, and the pixel definition parts are located on a side of the first electrodes away from the base substrate, and wherein the pixel definition layer is multiplexed as the first shielding layer, and the pixel definition parts are multiplexed as the first shielding parts.

In some embodiments, the pixel definition parts are provided as a ring shape, and orthographic projections of outer ring surfaces of the pixel definition parts on the base substrate overlap with edge lines of the orthographic projections of the first electrodes on the base substrate.

In some embodiments, the first shielding layer is arranged on a side of the pixel definition layer away from the base substrate, or the first shielding layer is arranged between the pixel definition layer and the first electrode layer.

In some embodiments, the first shielding parts are provided as a ring shape, orthographic projections of inner ring surfaces of the first shielding parts on the base substrate are located within orthographic projections of walls of the first via holes on the base substrate, and orthographic projections of outer ring surfaces of the first shielding parts on the base substrate overlap with edge lines of the orthographic projections of the first electrodes on the substrate.

In some embodiments, in the light-transmitting display area, the display panel further includes: a second shielding layer arranged on a side of the second electrode layer away from the base substrate, wherein the second shielding layer includes multiple second shielding parts corresponding to the multiple second electrodes, and orthographic projections of the second shielding parts on the base substrate overlap with the orthographic projections of the second electrodes on the base substrate, to block reflected light from the second electrodes.

In some embodiments, the second shielding parts are provided as a ring shape, orthographic projections of the light-emitting parts on the base substrate are located within inner ring lines of the orthographic projections of the second shielding parts on the base substrate, and the orthographic projections of the second electrodes on the base substrate are located within outer ring lines of the orthographic projections of the second shielding parts on the base substrate.

In some embodiments, the second shielding layer further includes a third shielding part, wherein an orthographic projection of the third shielding part on the base substrate overlaps with orthographic projections of the connection wires on the base substrate, to block reflected light from the connection wires.

In some embodiments, the orthographic projections of the connection wires on the base substrate are located within the orthographic projection of the third shielding part on the base substrate.

In some embodiments, the display panel further includes: an encapsulation layer group arranged on a side of the second electrode layer away from the base substrate, wherein the second shielding layer is arranged on a side of the encapsulation layer group away from the base substrate.

In some embodiments, the display panel further includes: a color film layer arranged on the side of the encapsulation layer group away from the base substrate, wherein the color film layer includes, in the light-transmitting display area, multiple light-transmitting parts of different colors, and includes, in the main display area, multiple light-transmitting parts of different colors and a shading part arranged between adjacent two light-transmitting parts.

In some embodiments, the display panel further includes: an anti-reflectance film arranged on a side of the color film layer away from the base substrate.

In some embodiments, in the light-transmitting display area, the display panel further includes: a light blocking layer arranged between the first electrode layer and the base substrate, wherein the light blocking layer includes multiple light blocking parts, and the orthographic projections of the first electrodes on the base substrate are located within orthographic projections of the light blocking parts on the base substrate.

In some embodiments, the orthographic projections of the light blocking parts on the base substrate coincide with the orthographic projections of the second electrodes on the base substrate.

In some embodiments, a light-emitting device includes the first electrode, the light-emitting part and the second electrode, the light-transmitting display area is provided with multiple light-emitting devices, and the multiple light-emitting devices include a first light-emitting device, a second light-emitting device and a third light-emitting device; and wherein a light-emitting unit includes one first light-emitting device, one second light-emitting device and one third light-emitting device, multiple light-emitting units include multiple first light-emitting units and multiple second light-emitting units, the multiple first light-emitting units and the multiple second light-emitting units are alternately arranged along a first direction, and the multiple first light-emitting units and the multiple second light-emitting units are alternately arranged along a second direction, and wherein the first direction and the second direction are parallel to a surface of the base substrate close to the first electrode layer, and the first direction intersects with the second direction.

In some embodiments, the second light-emitting device and the first light-emitting device in the first light-emitting unit are arranged on opposite two sides of the connection wire, a center of the second light-emitting device and a center of the first light-emitting device are located on a same straight line extending along the second direction, the third light-emitting device and the first light-emitting device are arranged on a same side of the connection wire, and the third light-emitting device overlaps with the connection wire; and the second light-emitting device and the first light-emitting device in the second light-emitting unit are arranged on opposite two sides of the connection wire, a center of the second light-emitting device and a center of the first light-emitting device are located on a same straight line extending along the second direction, the third light-emitting device and the second light-emitting device are arranged on a same side of the connection wire, and the third light-emitting device overlaps with the connection wire.

In some embodiments, the second light-emitting device in the first light-emitting unit and the second light-emitting device in the second light-emitting unit are arranged on a same side of a same connection wire, and the first light-emitting device in the first light-emitting unit and the first light-emitting device in the second light-emitting unit are arranged on the other same side of the same connection wire.

In some embodiments, the second light-emitting device and the first light-emitting device are provided as a circular shape, and the third light-emitting device is provided as an elliptical shape.

In some embodiments, a light-emitting device includes the first electrode, the light-emitting part and the second electrode, the light-transmitting display area is provided with multiple light-emitting devices, and the multiple light-emitting devices include a first light-emitting device, a second light-emitting device and a third light-emitting device; and wherein a light-emitting unit includes two first light-emitting devices, one second light-emitting device and one third light-emitting device, multiple light-emitting units are sequentially arranged along a first direction, and the multiple light-emitting units are staggeredly arranged along a second direction, and wherein the first direction and the second direction are parallel to a surface of the base substrate close to the first electrode layer, and the first direction intersects with the second direction.

In some embodiments, the two first light-emitting devices are located on a same side of the connection wire, the second light-emitting device and the third light-emitting device are located on a side of the connection wire away from the first light-emitting device, the second light-emitting device is located between two adjacent first light-emitting devices, and the third light-emitting device is located between two adjacent first light-emitting devices.

In some embodiments, the first light-emitting device is provided as one of a water-drop shape, a circular shape and an elliptical shape, and the second light-emitting device is provided as one of the water-drop shape, the circular shape and the elliptical shape.

In some embodiments, wherein the first light-emitting device and the second light-emitting device are provided as a circular shape, and wherein the first electrode of the first light-emitting device and the first electrode of the second light-emitting device include: a first electrode body; and a first electrode connection line, wherein one end of the first electrode connection line is connected to the first electrode body; and the second electrode of the first light-emitting device and the second electrode of the second light-emitting device include: a second electrode body; and a second electrode connection line, wherein one end of the second electrode connection line is connected to the second electrode body, and the other end of the second electrode connection line is connected to the connection wire; or wherein the first light-emitting device and the second light-emitting device are provided as a water-drop shape or an elliptical shape, the first electrode of the first light-emitting device and the first electrode of the second light-emitting device include a first electrode body, and the second electrode of the first light-emitting device and the second electrode of the second light-emitting device include a second electrode body.

In some embodiments, an orthographic projection of the first via hole on the base substrate is located within an orthographic projection of the second electrode body on the base substrate, and an orthographic projection of the second electrode connection line on the base substrate does not overlap with the orthographic projection of the first via hole on the base substrate.

In some embodiments, the first light-emitting device is a green light-emitting device, the second light-emitting device is a red light-emitting device, and the third light-emitting device is a blue light-emitting device.

In some embodiments, the connection wire extends along the first direction, and multiple light-emitting units sequentially arranged along the first direction are connected to a same connection wire.

According to another aspect of the present disclosure, a display device is provided. The display device includes: the display panel according to any of above aspects; and a photosensitive sensor arranged on a non-display surface of the display panel, wherein an orthographic projection of the photosensitive sensor on a display surface at least partially overlaps with the light-transmitting display area.

It should be understood that the general description above and the detailed description in the following are only illustrative and explanatory, and do not limit the present disclosure.

BRIEF DESCRIPTION OF THE DRAWINGS

The drawings herein, which are incorporated in and constitute a portion of this specification, illustrate embodiments consistent with the present disclosure and serve together with the specification to explain principles of the present disclosure. It is apparent that the drawings in the following description are only some embodiments of the present disclosure, and other drawings can be obtained based on the drawings by those of ordinary skill in the art without creative effort.

EXPLANATIONS OF REFERENCE NUMERALS

Figure 1:
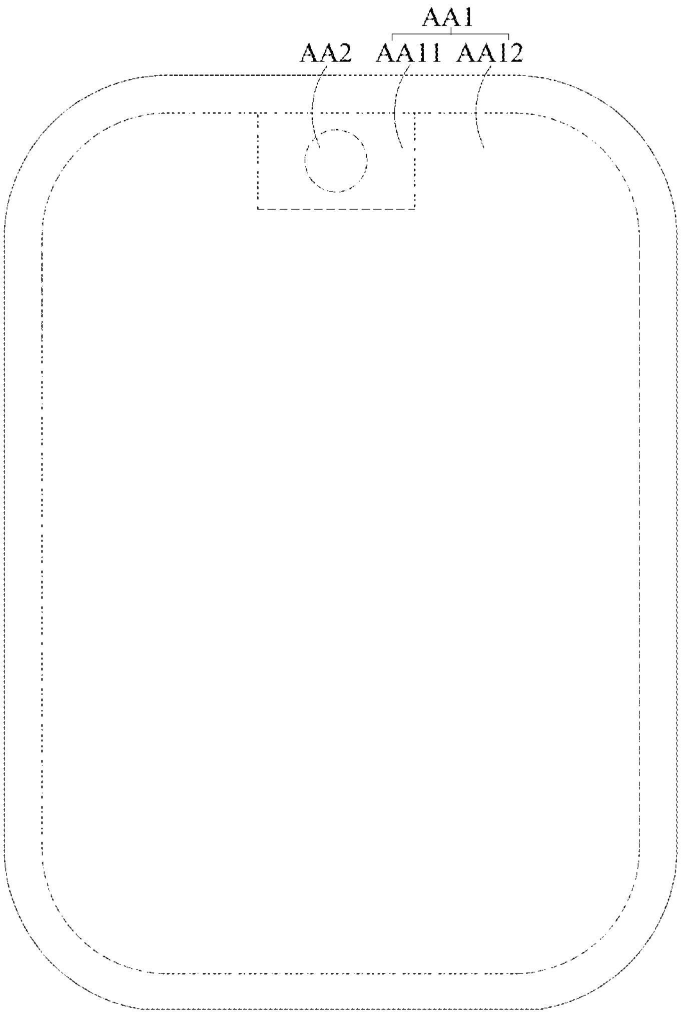
FIG. 1 is a schematic diagram of area division of a display panel according to embodiments of the present disclosure.

- 10. Pixel circuit;
- 11. Base substrate; 12. Shading layer; 13. Buffer layer; 14. Active layer; 15. Gate insulation layer; 16. Gate; 17. Interlayer dielectric layer; 181. Source; 182. Drain; 183. Light blocking layer; 1831. Light blocking part; 19. Passivation layer;
- 20. Light-emitting device; 21. First electrode layer; 211. First electrode; 2111. First electrode body; 2112. First electrode connection line; 22. Pixel definition layer; 221. First via hole; 222. Pixel definition part; 23. Light-emitting layer group; 231. Light-emitting part; 24. Second electrode layer; 241. Second electrode; 2411. Second electrode body; 2412. Second electrode connection line; 242. Connection wire; 25. First shielding layer; 251. First shielding part; 2511. Inner ring surface; 2512. Outer ring surface; 26. Second shielding layer; 261. Second shielding part; 262. Third shielding part;
- 30. Encapsulation layer group;
- 40. Color film layer; 41. Light-transmitting part; 42. Shading part;
- 50. Anti-reflectance film;
- 61. Transparent wire; 62. Planarization layer;
- 100. Driving backplane; 200. Light-emitting substrate;
- 201. First light-emitting unit; 202. Second light-emitting unit; 203. Light-emitting unit;
- 300. Photosensitive sensor; 400. Display panel;
- R. Second light-emitting device; G. First light-emitting device; B. Third light-emitting device; AA1. Main display area; AA11, Transition area; AA12. Normal display area; AA2. Light-transmitting display area; PX, sub pixel;
- X. First direction; Y. Second direction; Z. Third direction.

DETAILED DESCRIPTION

Example embodiments will now be described more fully with reference to the drawings. However, the example embodiments can be implemented in a variety of forms and should not be construed as being limited to the embodiments set forth herein. Rather, the provision of these embodiments makes the present disclosure comprehensive and complete and conveys ideas of the example embodiments in a comprehensive manner to those skilled in the art. The same reference numerals in the drawings indicate the same or similar structures, and thus their detailed description will be omitted. In addition, the drawings are only schematic illustrations of the present disclosure and are not necessarily drawn to scale.

Although relative terms such as "upper" and "lower" are used in this specification to describe a relative relationship of one component and another component, these terms are used in this specification only for convenience, for example, according to a direction of the example shown in the drawings. It will be appreciated that if the device illustrated is turned upside down, the component described as "upper" will become the "lower" component. When a certain structure is "on" another structure, it may mean that the certain structure is integrally formed on the other structure, or it may mean that the certain structure is "directly" arranged on the other structure, or that the certain structure is "indirectly" arranged on the other structure through yet another structure.

Terms "a", "an", "the", "said" and "at least one" are used to indicate presence of one or more elements/components/etc. Terms "include" and "comprise" are used to indicate an open-ended inclusion, and mean presence of additional elements/components/etc., in addition to listed elements/components/etc. Terms "first", "second", "third", etc., are used as markings only, instead of limiting the number of objects.

In the present disclosure, unless otherwise specified and limited, the term "connection" should be understood broadly, for example, the "connection" can be a fixed connection, a detachable connection, or integrated as a whole. The "connection" can be directly connected or indirectly connected through intermediate media. The "and/or" is simply used to describe an association relationship between associated objects, indicating that there can be three types of relationships. For example, A and/or B can represent the existence of A alone, the existence of both A and B, and the existence of B alone. In addition, the character '/' herein generally indicates that the associated objects are of an 'or' relationship.

Embodiments of the present disclosure provide a display panel, as shown in FIGS. 1-27. The display panel has a main display area AA1 and a light-transmitting display area AA2 arranged adjacently. The display panel can include a base substrate 11, a first electrode layer 21, a pixel definition layer 22, a light-emitting layer group 23, and a second electrode layer 24. The first electrode layer 21 is arranged on a side of the base substrate 11. The first electrode layer 21 includes multiple first electrodes 211 arranged at intervals. The pixel definition layer 22 is arranged on a side of the first electrode layer 21 away from the base substrate 11. The pixel definition layer 22 is provided with multiple first via holes 221. The multiple first via holes 221 are correspondingly connected to the multiple first electrodes 211. The light-emitting layer group 23 is at least partially arranged within the first via holes 221, and the light-emitting layer group 23 located within the first via holes 221 is a light-emitting part 231. The second electrode layer 24 is arranged on a side of the light-emitting layer group 23 away from the base substrate 11. In the light-transmitting display area AA2, the second electrode layer 24 can include multiple second electrodes 241 and multiple connection wires 242. The multiple second electrodes 241 are arranged at intervals. The second electrodes 241 are arranged on a side of the light-emitting part 231 away from the base substrate 11. An orthographic projection of the second electrode 241 on the base substrate 11 covers an orthographic projection of the first electrode 211 on the base substrate 11. The multiple connection wires 242 are connected between the multiple second electrodes 241.

The display panel according to embodiments of the present disclosure, on one aspect, in the light-transmitting display area AA2, the second electrode layer 24 includes multiple connection wires 242 and multiple spaced second electrodes 241. That is, the second electrode layer 24 is patterned to reduce an overall area of the second electrode layer 24, reducing the area of reflection surfaces, thereby reducing the reflectivity and ensuring the overall-black effect. On another aspect, when the area of the second electrode 241 is small, the resistance will inevitably increase, which will lead to decrease in the current and the luminous intensity of the light-emitting part 231. The orthographic projection of the second electrode 241 on the base substrate 11 is designed to cover the orthographic projection of the first electrode 211 on the base substrate 11, rendering the area of the second electrode 241 is made to be as large as possible, so as to ensure that the luminous intensity of the light-emitting part 231 can be maintained while the reflectivity is reduced. On one further aspect, the second electrode 241 is made to be larger, to avoid the second electrode connection line 2412 connected with the second electrode 241 extending into the first via hole 221, causing bending and fracture on a wall of the first via hole 221.

It should be noted that in the present disclosure, a first direction X and a second direction Y are parallel to a surface of the base substrate 11 that is close to the first electrode layer 21, and the first direction X intersects with the second direction Y, for example, the first direction X is perpendicular to the second direction Y. A third direction Z is perpendicular to the surface of the base substrate 11 that is close to the first electrode layer 21.

The display panel can be an OLED (Organic Light Emitting Diode) display panel, a QLED (Quantum Dot Light Emitting Diode) display panel, and other display panels. The display panel has a light-output side and a non-light-output side, with the light-output side and the non-light-output side arranged relative to each other. A display screen can be displayed on the light-output side, and the display screen is a display side. The OLED display panel is characterized in that self-illumination, high brightness, wide viewing angle, fast response time, and the ability to produce R, G, and B full color components. The OLED display panel is thus considered as a star product for the next-generation display.

The OLED is taken as an example for illustration in the following.

Figure 2:
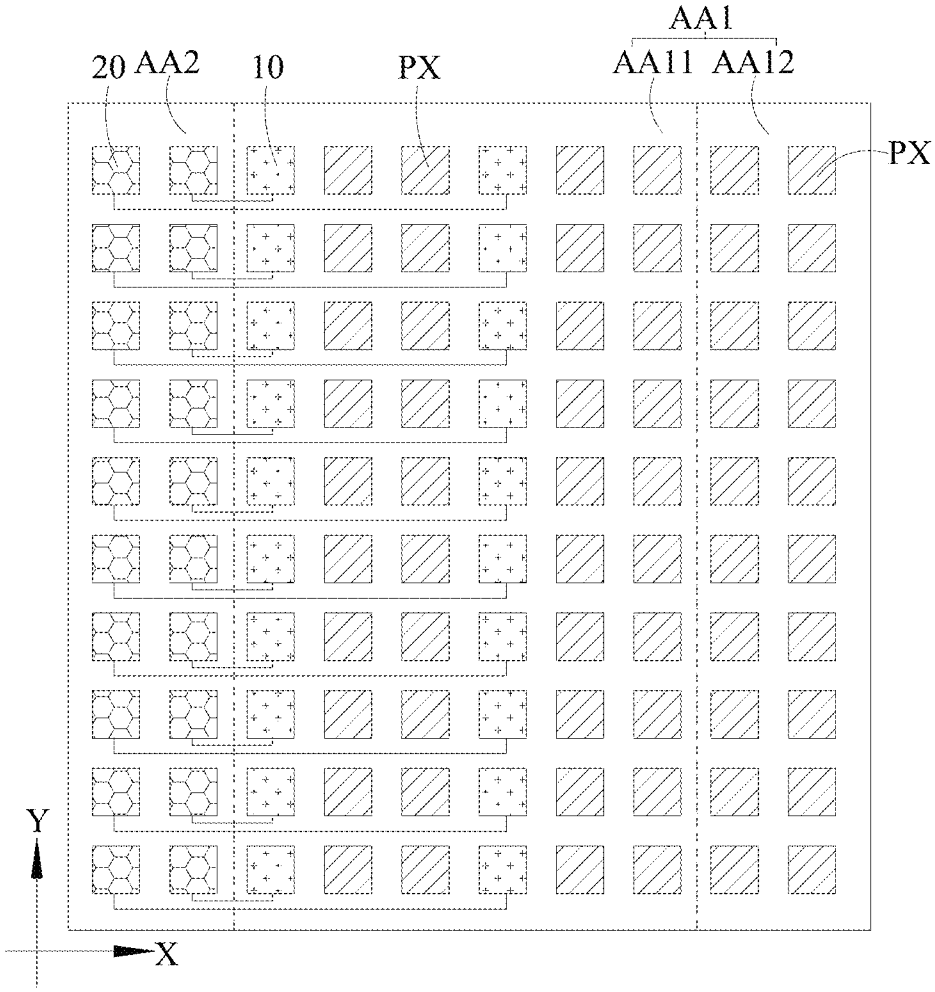
FIG. 2 is a schematic structural diagram of a layout of pixels, driving circuits and light-emitting devices in each area.
Figure 3:
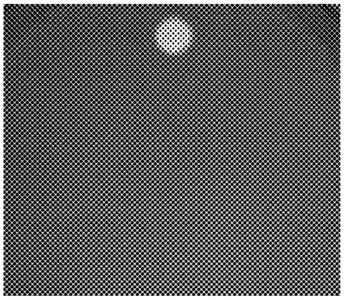
FIG. 3 is a schematic diagram of poor overall-black effect of the display device.

As shown in FIGS. 1 and 2, the display panel can be divided into a light-transmitting display area AA2 and a main display area AA1. The main display area AA1 can include a transition area AA11 and a normal display area AA12. The transition area AA11 surrounds the light-transmitting display area AA2, while the normal display area AA12 surrounds the transition area AA11.

The display panel is suitable for the display panel having a camera installed below the screen. The light-transmitting display area AA2 is used to correspondingly install a camera component, and the normal display area AA12 is used for displaying an image. Since the transition area AA11 and the light-transmitting display area AA2 also need to display images, but the light-transmitting display area AA2 also needs to enable light to pass through to the camera on a non-display side. The camera can use the light transmitted to the non-display side to operate. In order to avoid pixel elements in the light-transmitting display area AA2 (such as thin-film transistors, a light-emitting device 20, etc.) blocking the camera, a pixel circuit 10 will not be arranged in the light-transmitting display area AA2, with only a transparent light-emitting device 20 being provided.

The light-emitting device 20 arranged in the light-transmitting display area AA2 needs to be driven by the pixel circuit 10 to emit light. Therefore, multiple pixel circuits 10 are arranged in the transition area AA11, and the pixel circuit 10 in the transition area AA11 is connected to the light-emitting device 20 in the light-transmitting display area AA2 through a transparent wire 61.

It should be noted that not only the camera but also an infrared sensor, a fingerprint sensor and other photosensitive sensors can be installed in the light-transmitting display area AA2.

The OLED display panel can reflect light, and when external natural light projects on the OLED display panel, the light will pass through the encapsulation layer group 30 and be reflected back from a metal cathode, which renders the OLED display panel to look like a silver reflective foil, resulting in a significant decrease in display effect and contrast in places with slightly stronger ambient light. This means that if the OLED display panel is viewed under light or sunlight, it is difficult to see the display panel clearly due to the reflected light.

Therefore, in general, the OLED display panel requires the use of a polarizer to reduce light reflection. The polarizer is attached to the display panel and has an anti-reflectance effect. The polarizer serves as a filter for filtering and adjusting incoming light from outside.

However, adding the polarizer to the display panel will reduce the light output efficiency of the display panel and reduce the brightness of the display panel under the same power consumption. The polarizer can, in theory, only allow half of the light to pass through, which means that when the light passes through the polarizer, the brightness decreases by more than 50%. In order to provide the visibility for mobile phones under strong light in daily use, the display panel has to continue to increase brightness, resulting in increased power consumption and reduced lifetime.

In addition, a thickness of the polarizer is between 50-100 microns (μm). The polarizer requires adhesive, which also increases a thickness of the display panel. In the current display panel structure, the polarizer accounts for half of the thickness, resulting in a significant increase in the thickness of the entire OLED display panel.

For a foldable display device, the display panel must be manufactured as thin as possible, so as to reduce a bending radius during a bending process and prevent a folding area from stretching for a long time, which results changes in length and ultimately forms wrinkles, reducing the lifetime of the display panel. Therefore, the polarizer with relatively large thickness has become one of the problems that need to be solved for the further development of the foldable display device.

With the development of the foldable display device, polarizer free technology is applied to the display panel to enhance theoretical brightness and reduce the bending radius of the display panel, so as to enhance durability.

At present, the polarizer free technology is called a Pol-less structure, also known as COE structure (Color Filter On Encapsulation). The main principle is that when external light projects on the display panel, some of the light will be absorbed by a black matrix, and another portion of the light will pass through a color filter part in a color film layer 40. The light passing through a green filter part is only green, the light passing through a red filter part is only red, and the light passing through a blue filter part is only blue. After these rays are reflected, a portion of the rays that reach the black matrix will be absorbed by the black matrix, while the other portion of the rays that reach the color filter will be mostly absorbed by the color filter. Because the green filter part allows only the green light to pass through, the red filter part allows only the red light to pass through, and the blue filter part allows only the blue light to pass through (for example, if the red light is reflected onto the green and blue filter parts, the red light will be absorbed, and only when the red light is reflected onto the red filter part can it be emitted), the reflectivity of the display panel can be greatly reduced through the color film layer 40.

The polarizer free technology results in lower power consumption of the display panel at the same display brightness, or higher brightness of the display panel at the same power consumption. In addition, since the color film layer 40 is coated and usually does not exceed 10 microns in thickness, it can significantly reduce the thickness of the display panel compared to the polarizer, which is beneficial for extending the lifetime of the foldable display device and reducing the cost of using the polarizer.

However, in order to further increase the transmittance of the light-transmitting display area AA2 and improve the quality of photography, the color film layer 40 does not have a black matrix arranged in the light-transmitting display area AA2. Such arrangement will allow the external light to pass through the color film layer 40 and reach the interior of the display panel. The metal layer inside the display panel will reflect the incident light, and the reflected light will not be blocked by the black matrix and will shoot out of the display panel, resulting in an increase in the reflectivity of the light-transmitting display area AA2. Due to the black matrix arranged in the color film layer 40, the reflectivity of the main display area AA1 is relatively low. As a result, the overall-black effect of the display panel is poor, resulting in the effect shown in FIG. 3, and the light-transmitting display area AA2 is slightly brighter as a whole.

Figure 4:
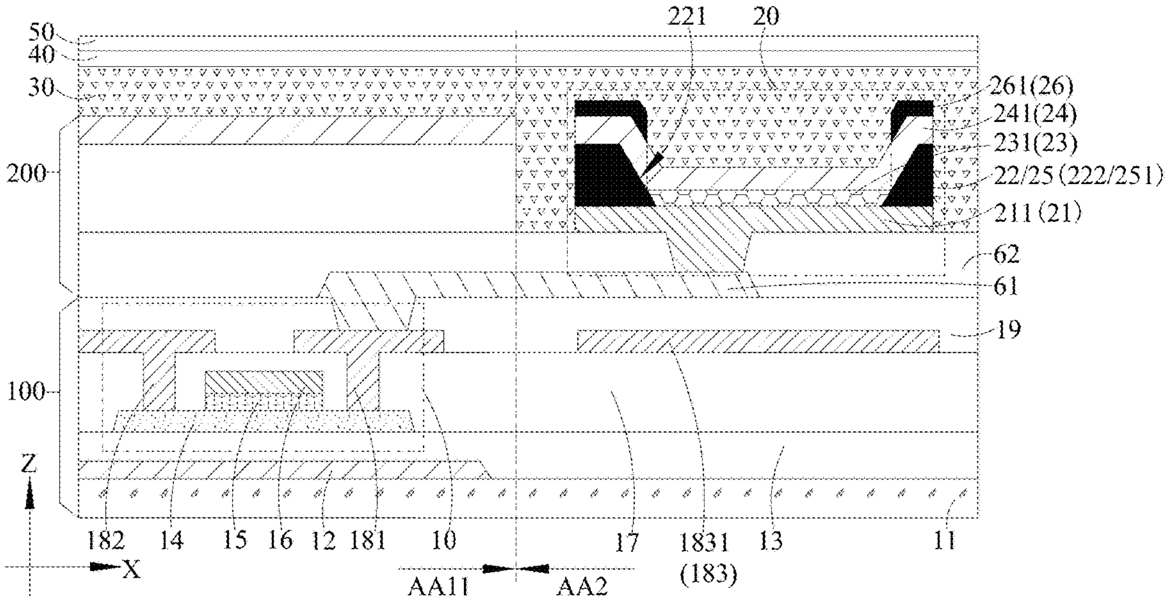
FIG. 4 is a schematic structural diagram of an exemplary implementation of a display panel according to embodiments of the present disclosure.
Figure 5:
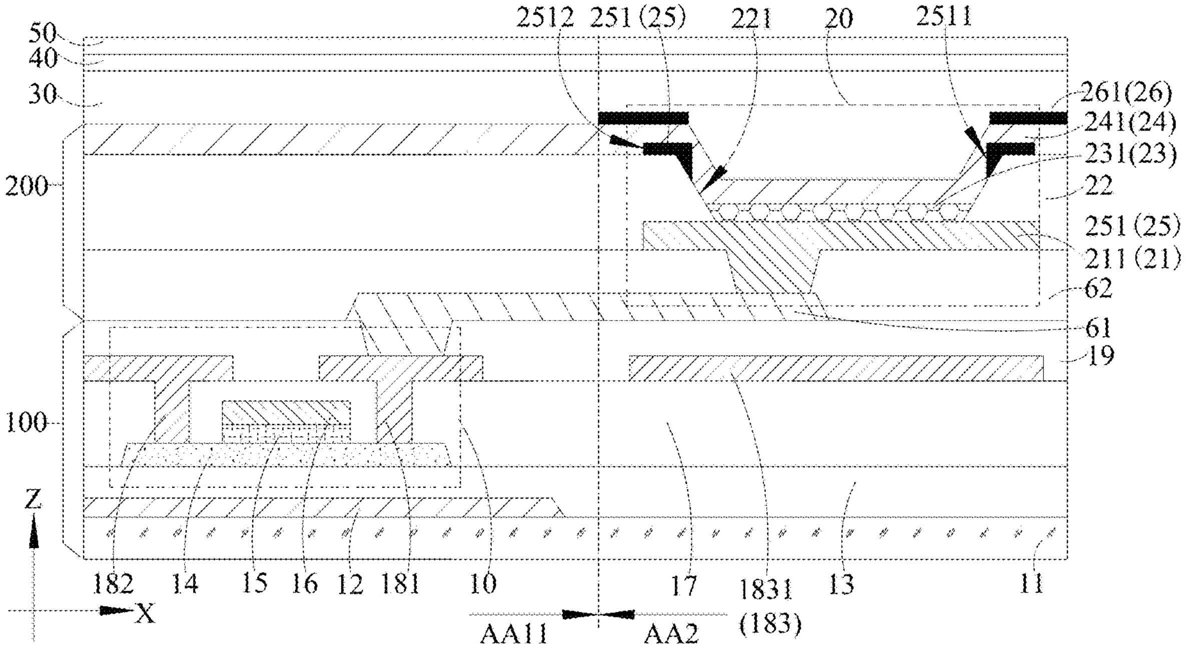
FIG. 5 is a schematic structural diagram of an exemplary implementation of a display panel according to embodiments of the present disclosure.

As shown in FIGS. 4 and 5, only one thin film transistor is illustrated, and the pixel circuit 10 will be described in detail in the following by taking the one thin-film transistor as an example. The display panel can include a driving backplane 100 and a light-emitting substrate 200. The driving backplane 100 can include multiple pixel circuits 10 arranged in an array. The light-emitting substrate 200 can include multiple light-emitting devices 20 arranged in an array. The pixel circuit 10 can drive the light-emitting device 20 to emit light.

In some embodiments, the driving backplane 100 can include a base substrate 11. A material of the base substrate 11 can include an inorganic material, and for example, the inorganic material can be glass, quartz or metal. The material of the base substrate 11 can also include an organic material, and for example, the organic material can be a resin material such as polyimide, polycarbonate, polyacrylate, polyetherimide, polyethersulfone, polyethylene terephthalate and polyethylene naphthalate. The base substrate 11 can be formed by multiple material layers. For example, the base substrate 11 can include multiple base layers, and a material of the base layer can be any of the materials mentioned above. In some embodiments, the base substrate 11 can also be formed by a single layer, which can be any of the materials mentioned above.

A shading layer 12 can also be provided on a side of the base substrate 11. The light emitted from the base substrate 11 into an active layer 14 will generate photo-generated carriers in the active layer 14, which will have a significant impact on the characteristics of the thin film transistor and ultimately affect the display quality of the display device.

The shading layer 12 can shade the light emitted from the base substrate 11, thereby avoiding any impact on the characteristics of the thin film transistor and avoiding affecting the display quality of the display device.

A buffer layer 13 can also be formed on a side of the shading layer 12 away from the base substrate 11. The buffer layer 13 plays a role in blocking water vapor and impurity ions in the base substrate 11 (especially organic materials), and in increasing hydrogen ions for the active layer 14 subsequently formed. The buffer layer 13 is made of an insulating material, which can isolate the shading layer 12 from the active layer 14.

The active layer 14 is arranged on a side of the buffer layer 13 away from the base substrate 11. The active layer 14 can include a channel part and a conductor part arranged at both ends of the channel part. A gate insulation layer 15 is arranged on a side of the active layer 14 away from the base substrate 11, and a gate 16 is arranged on a side of the gate insulation layer 15. An interlayer dielectric layer 17 is arranged on a side of the gate 16 away from the base substrate 11, and a via hole is arranged in the interlayer dielectric layer 17, which is connected to the conductor part. A source 181 and a drain 182 are arranged on a side of the interlayer dielectric layer 17 away from the base substrate 11. The source 181 and the drain 182 are respectively connected to two conductor parts through two via holes. A passivation layer 19 is arranged on the side of the source 181 and drain 182 away from the base substrate 11, and a via hole is arranged in the passivation layer 19, which is connected to the source 181. The active layer 14, the gate 16, the source 181, and the drain 182 form the thin film transistor.

It should be noted that the thin film transistor described in embodiments of the present disclosure is a top-gate thin film transistor. In some other embodiments of the present disclosure, the thin film transistor can also be a bottom-gate or a double-gate thin film transistor, and the specific structure of the thin film transistor will not be elaborated herein. In some embodiments, in the case where thin film transistors with opposite polarity are used or a current direction during a circuit operation changes, the functions of "source 181" and "drain 182" are sometimes interchanged. Therefore, in the present specification, "source 181" and "drain 182" can be interchanged.

A structure of the driving backplane 100 in the normal display area AA12 and in the transition area AA11 can be the same.

Due to the absence of a pixel circuit 10 in the light-transmitting display area AA2, the driving backplane 100 can include in the light-transmitting display area AA2 a base substrate 11, a buffer layer 13, an interlayer dielectric layer 17, a passivation layer 19, etc. that are sequentially stacked, and other transparent insulation layers can also be included.

In embodiments of the present disclosure, reference is continued to be made to FIGS. 4 and 5, in the light-transmitting display area AA2, a light blocking layer 183 can be arranged between the interlayer dielectric layer 17 and the passivation layer 19, so that the light blocking layer 183 is located between the first electrode 211 and the base substrate 11. The light blocking layer 183 can be provided along with a source and drain layer in the same layer and with the same material, that is, the light blocking layer 183 can be formed along with the source and drain layer through the same patterning process.

The light blocking layer 183 can include multiple light blocking parts 1831, and an orthographic projection of the first electrode 211 on the base substrate 11 is located within an orthographic projection of the light blocking part 1831 on the base substrate 11. For example, the orthographic projection of the first electrode 211 on the base substrate 11 can coincide with the orthographic projection of the light blocking part 1831 on the base substrate 11, or the orthographic projection of the first electrode 211 on the base substrate 11 can be located within the orthographic projection of the light blocking part 1831 on the base substrate 11, and an area of the orthographic projection of the first electrode 211 on the base substrate 11 is smaller than an area of the orthographic projection of the light blocking part 1831 on the base substrate 11.

Such arrangement allows the light blocking part 1831 to completely block the first electrode 211. A process of forming a second electrode 241 includes forming a second electrode material layer on a side of the pixel definition layer 22 and the light-emitting layer group 23 away from the base substrate 11, and then forming the second electrode 241 by using a laser to irradiate the second electrode material layer from a side where the base substrate 11 is located to remove unwanted second electrode material layer. The first electrode 211 is located on a side of the second electrode 241 close to the base substrate 11. Therefore, when using the laser to irradiate the second electrode material layer, the first electrode 211 will inevitably be irradiated, causing damage to the first electrode 211. The light blocking part 1831 can block the laser and prevent the laser from irradiating the first electrode 211, thereby avoiding damage to the first electrode 211.

In some embodiments, a portion of the second electrode material layer blocked by the light blocking part 1831 is not removed to form the second electrode 241, and thus the orthographic projection of the light blocking part 1831 on the base substrate 11 coincides with an orthographic projection of the second electrode 241 on the base substrate 11.

It should be noted that the "coincide" herein is not completely coinciding, but has a certain degree of error. For example, when the laser power used is high or the irradiation time is long, more portion of the second electrode material layer will be removed, so that the orthographic projection of the second electrode 241 on the base substrate 11 is within the orthographic projection of the light blocking part 1831 on the base substrate 11, and an area of the orthographic projection of the second electrode 241 on the base substrate 11 is less than an area of the orthographic projection of the light blocking part 1831 on the base substrate 11. On the contrary, when the laser power used is low or the irradiation time is short, less portion of the second electrode material layer will be removed, so that the orthographic projection of the light blocking part 1831 on the base substrate 11 is within the orthographic projection of the second electrode 241 on the base substrate 11, and an area of the orthographic projection of the light blocking part 1831 on the base substrate 11 is less than an area of the orthographic projection of the second electrode 241 on the base substrate 11. That is, an area of the orthographic projection of the second electrode 241 on the base substrate 11 is 90%~110% of an area of the orthographic projection of the light blocking part 1831 on the base substrate 11. However, the difference between them all belongs to process errors and are within the protection scope of the present disclosure.

In some embodiments of the present disclosure, the light blocking layer 183 can also be provided along with the gate layer in the same layer and with the same material, that is, the light blocking layer 183 can be formed along with the gate layer through the same patterning process. In the case where a second source and drain layer is provided, the light blocking layer 183 can also be provided along with the second source and drain layer in the same layer and with the same material, that is, the light blocking layer 183 can be formed along with the second source and drain layer through the same patterning process. In the case where a second gate layer is provided, the light blocking layer 183 can also be provided along with the second gate layer in the same layer and with the same material, that is, the light blocking layer 183 can be formed along with the second gate layer through the same patterning process. In some embodiments, the light blocking layer 183 can also be provided as one, two, or more light blocking layers, that is, any one, two, or more light blocking layers 183 described above can be selected as needed.

The closer the light blocking layer 183 is arranged to the first electrode layer 21, the more accurate the blocking to the first electrode layer 21 is. The closer the light blocking layer 183 is arranged to the first electrode layer 21, the closer the light blocking layer 183 is to the second electrode layer 24, and the more accurate the blocking to the second electrode layer 24 is, resulting in a smaller error of the second electrode 241 formed.

In some embodiments, in the case where the second electrode 241 is formed through other processes, the light blocking layer 183 can also be not provided.

In embodiments of the present disclosure, reference is continued to be made to FIGS. 4 and 5, in the light-transmitting display area AA2 and the transition area AA11, a transparent conductive layer is arranged on a side of the passivation layer 19 away from the base substrate 11. The transparent conductive layer can include multiple transparent wires 61, and the transparent wire 61 is connected to the light-emitting device 20 in the light-transmitting display area AA2 and the pixel circuit 10 in the transition area AA11.

When the light-emitting device 20 in the light-transmitting display area AA2 has a large density and a large quantity, two or more transparent conductive layers can be arranged, and an insulation layer is provided between adjacent two transparent conductive layers. Each of the transparent conductive layers can include multiple transparent wires 61, so as to meet the requirement of connecting the light-emitting device 20 in the light-transmitting display area AA2 with the pixel circuit 10 in the transition area AA11. On the contrary, when the light-emitting device 20 in the light-transmitting display area AA2 has a small density and a small quantity, only one transparent conductive layer can be arranged to meet the requirement of connecting the light-emitting device 20 in the light-transmitting display area AA2 with the pixel circuit 10 in the transition area AA11.

A material of the transparent conductive layer can be ITO (Indium Tin Oxide), IZO (Indium Zinc Oxide), and so on.

In some embodiments, referring to FIGS. 4, 5, 6, 8, 12, 16, 20 and 24, a planarization layer 62 is arranged on a side of the transparent conductive layer away from the base substrate 11, and a first electrode layer 21 is arranged on a side of the planarization layer 62 away from the base substrate 11. The first electrode layer 21 can include multiple first electrodes 211. The first electrode 211 can be a pixel electrode, and the first electrode 211 is connected to the transparent wire 61 through a via hole in the planarization layer 62, thereby connecting the first electrode 211 to the pixel circuit 10 through the transparent wire 61.

The first electrode layer 21 can have a film stacked structure, in which a high work function material layer and a reflective material layer are stacked. The high work function material layer can include indium tin oxide (ITO), indium zinc oxide (IZO), zinc oxide (ZnO), or indium oxide (In2O3). The reflective material layer can include silver (Ag), magnesium (Mg), aluminum (Al), platinum (Pt), palladium (Pd), aurum (Au), nickel (Ni), neodymium (Nd) iridium (Ir), chromium (Cr), lithium (Li), calcium (Ca) or mixtures thereof. The high work function material layer can be arranged above the reflective material layer, so as to be closer to the light-emitting layer group 23. The first electrode 211 can have a multi-layer structure of ITO/Mg, ITO/MgF2, ITO/Ag, and ITO/Ag/ITO, but the present disclosure is not limited to this.

Figure 6:
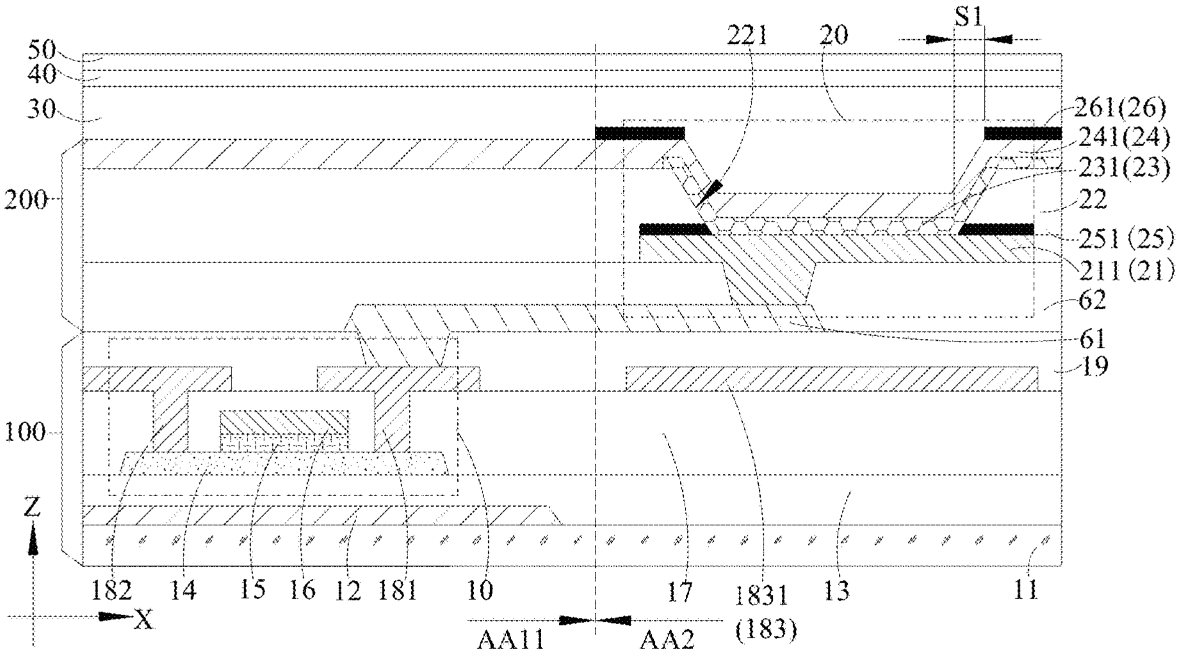
FIG. 6 is a schematic structural diagram of an exemplary implementation of a display panel according to embodiments of the present disclosure.

In some embodiments, as shown in FIGS. 4, 5 and 6, a pixel definition layer 22 is arranged on a side of the first electrode layer 21 away from the base substrate 11. Multiple first via holes 221 are arranged in the pixel definition layer 22, and the multiple first via holes 221 are connected to the multiple first electrodes 211 correspondingly. That is, the first via hole 221 and the first electrode 211 are in one-by-one correspondence, and the first via hole 221 exposes at least part of the first electrode 211. As shown in FIGS. 5 and 6, in the case where the pixel definition layer 22 is not multiplexed as the first shielding layer 25, the pixel definition layer 22 is provided as a whole.

A wall of the first via hole 221 is provided in an inclined manner, to increase a cross-sectional area of a section of the first via hole 221 parallel to a first direction X as a distance to the base substrate 11 increases along a third direction Z. That is, the first via hole 221 is provided in a shape with an opening greater than a bottom, and an inclination angle is greater than or equal to 5° and less than or equal to 50°. The first direction X is parallel to a surface of the base substrate 11 that is close to the first electrode layer 21, and the third direction Z is perpendicular to the surface of the base substrate 11 that is close to the first electrode layer 21. The second electrode formed subsequently is also formed on the wall of the first via hole 221.

The pixel definition layer 22 can include an inorganic insulating material such as silicon oxide, silicon nitride, silicon oxynitride, hafnium oxide, aluminum oxide, titanium oxide, tantalum oxide or zinc oxide, or the pixel definition layer 22 can include an organic insulating material such as polyacrylate resin, epoxy resin, phenolic resin, polyamide resin, poly (Imide) resin, unsaturated polyester resin, polyphenylene ether resin, polyphenylene sulfide resin or benzocyclobutene (BCB). The pixel definition layer 22 can be a single-film layer or a multi-film layer, and the multi-film layer forms stacked layers of different materials.

Referring to FIGS. 4, 5, 6, 9, 13, 17, 21 and 25, at least a portion of the light-emitting layer group 23 is provided within the first via hole 221. For example, the light-emitting layer group 23 can include multiple light-emitting parts 231 arranged at intervals, the light-emitting part 231 and the first via hole 221 are arranged in one-by-one correspondence, and one light-emitting part 231 is provided within one first via hole 221. Such arrangement allows all the light-emitting parts 231 to be located in the first via holes 221, so that all of the light-emitting layer group 23 are provided within the first via holes 221. This structure is generally applicable to the case where the colors of the light-emitting devices 20 are different, for example, the light emitted by the light-emitting device 20 can be red, blue, green or white.

As shown in FIG. 5, the light-emitting layer group 23 can also be arranged as a whole layer. A portion of the light-emitting layer group 23 is arranged within the first via hole 221, the portion of the light-emitting layer group 23 that is arranged within the first via hole 221 is the light-emitting part 231, and the other portion is arranged on a side of the pixel definition layer 22 away from the base substrate 11. The light-emitting layer group 23 that is arranged within the first via hole 221 is driven to emit light through the first electrode 211, and the light-emitting layer group 23 that is arranged on the side of the pixel definition layer 22 away from the base substrate 11 would not emit light due to the absence of the driving of the first electrode 211.

As shown in FIG. 4, the pixel definition layer 22 can be multiplexed as the first shielding layer 25. That is, the pixel definition layer 22 not only can define the light-emitting area and accommodate the light-emitting layer group 23, but also can block the reflection of incident light by the first electrode 211.

In the case where the pixel definition layer 22 is multiplexed as the first shielding layer 25, in order to block light, it is necessary to set the pixel definition layer 22 to black. The pixel definition layer 22 is not provided as a whole, but is provided as multiple islands that are arranged at intervals. In some embodiments, the pixel definition layer 22 (the first shielding layer 25) can include multiple pixel definition parts 222 (first shielding parts 251). The multiple pixel definition parts 222 (first shielding parts 251) and the multiple first electrodes 211 are arranged in one-by-one correspondence, and the pixel definition parts 222 (first shielding parts 251) are located on a side of the first electrodes 211 away from the base substrate 11. The pixel definition part 222 is multiplexed as the first shielding part 251. Since each pixel definition part 222 is provided with a first via hole 221, the pixel definition part 222 is provided as a ring. An orthographic projection of an outer ring surface of the pixel definition part 222 on the base substrate 11 can coincide with an edge line of an orthographic projection of the first electrode 211 on the base substrate 11. In some embodiments, a width of the pixel definition part 222 can be greater than or equal to 1 micron and less than or equal to 10 microns, which is a width in a direction parallel to a surface of the base substrate 11 that is close to the first electrode layer 21.

Such arrangement allows the pixel definition part 222 and the light-emitting part 231 to cover the first electrode 211 completely, avoiding external incident light from irradiating the first electrode 211, thereby avoiding reflection of the external incident light by the first electrode 211 and generation of the reflected light, reducing the reflectivity of the light-transmitting display area AA2, and ensuring the overall-black effect. In some embodiments, the orthographic projection of the outer ring surface of the pixel definition part 222 on the base substrate 11 can coincide with the orthographic projection of the first electrode 211 on the base substrate 11, so that the pixel definition part 222 can play the role of shielding the first electrode 211. The pixel definition part 222 is provided as small as possible to ensure an aperture ratio, so as to ensure the light transmittance of the light-transmitting display area AA2.

In some embodiments of the present disclosure, as shown in FIG. 5, in the case where the pixel definition layer 22 is not multiplexed as the first shielding layer 25, the first shielding layer 25 can be arranged on a side of the pixel definition layer 22 away from the base substrate 11. The first shielding layer 25 can include multiple first shielding parts 251, and the multiple first shielding parts 251 and the multiple first electrodes 211 are arranged in one-by-one correspondence. An orthographic projection of the first shielding part 251 on the base substrate 11 overlaps with the orthographic projection of the first electrode 211 on the base substrate 11, so that the first shielding part 251 can block the external incident light from irradiating the first electrode 211. Even if some of the incident light irradiates the first electrode 211 to generate the reflected light, the first shielding part 251 can block the reflected light from the first electrode 211 from shooting out, reducing the reflectivity of the light-transmitting display area AA2, and ensuring the overall-black effect.

Since the first shielding part 251 needs to avoid the first via hole 221, the first shielding part 251 can be provided as a ring, and an orthographic projection of an inner ring surface of the first shielding part 251 on the base substrate 11 can be located within an orthographic projection of a wall of the first via hole 221 on the base substrate 11. In some embodiments, the light-emitting layer group 23 can include multiple light-emitting parts 231 arranged at intervals. In the case where one light-emitting part 231 is provided within one first via hole 221, a thickness of the light-emitting part 231 is generally smaller than a depth of the first via hole 221, thus the light-emitting part 231 does not fill up the first via hole 221. An inner edge of the first shielding part 251 can extend to a portion where the wall of the first via hole 221 is away from the base substrate 11, so that the orthographic projection of the inner ring surface of the first shielding part 251 on the base substrate 11 can be located within the orthographic projection of the wall of the first via hole 221 on the base substrate 11. That is, the orthographic projection of the wall of the first via hole 221 on the base substrate 11 covers and is larger than the orthographic projection of the inner ring surface of the first shielding part 251 on the base substrate 11. In some embodiments, a width of the first shielding part 251 can be greater than or equal to 1 micron and less than or equal to 10 microns, which is a width in the direction parallel to the surface of the base substrate 11 that is close to the first electrode layer 21.

In some embodiments, the orthographic projection of the inner ring surface of the first shielding part 251 on the base substrate 11 can coincide with an edge line of an orthographic projection of the light-emitting part 231 on the base substrate 11, and an orthographic projection of an outer ring surface of the first shielding part 251 on the base substrate 11 overlaps with the edge line of the orthographic projection of the first electrode 211 on the base substrate 11. As a result, the first shielding part 251 and the light-emitting part 231 can cover the first electrode 211 completely, avoiding external incident light from irradiating the first electrode 211, thereby avoiding reflection of the external incident light by the first electrode 211 and generation of the reflected light, reducing the reflectivity of the light-transmitting display area AA2, and ensuring the overall-black effect. Moreover, since only the light-emitting part 231 can emit light, the first shielding part 251 does not shield the light-emitting part 231, and the aperture ratio is ensured, thereby ensuring the light-emitting area and the brightness of each light-emitting device 20.

In the case where the light-emitting layer group 23 is arranged as a whole layer, the light-emitting layer group 23 covers the wall of the first via hole 221 completely. Therefore, the light-emitting layer group 23 located within the first via hole 221 can emit light, so as to avoid shielding by the first shielding part 251, which may shield the light-emitting layer group 23 from emitting light. In some embodiments, the orthographic projection of the inner ring surface of the first shielding part 251 on the base substrate 11 can coincide with the outer edge line of the orthographic projection of the wall of the first via hole 221 on the base substrate 11, and the orthographic projection of the outer ring surface of the first shielding part 251 on the base substrate 11 overlaps with the edge line of the orthographic projection of the first electrode 211 on the base substrate 11. As a result, the light-emitting part 231 located within the first via hole 221 and the first shielding part 251 cover the first electrode 211 completely, allowing the first shielding part 251 to block the external incident light from irradiating the first electrode 211. Even if some of the incident light irradiates the first electrode 211 and generates reflected light, the first shielding part 251 can block the reflected light from the first electrode 211 from shooting out, reducing the reflectivity of the light-transmitting display area AA2, and ensuring the overall-black effect.

In some embodiments, as shown in FIG. 6, the first shielding layer 25 can be arranged on a side of the first electrode 211 away from the base substrate 11. The specific structure of the first shielding layer 25 has been explained in detail above, which will not be repeated here. In some embodiments, the first shielding layer 25 may not be arranged.

It should be noted that the coincide or overlap mentioned in this specification is not completely coinciding or overlapping, but has a certain degree of error. For example, if the difference is within 10%, it can be considered as coinciding or overlapping. It can also be considered that both the coincide or the overlap are requirements during design, but after the product has been manufactured, there may be certain degree of error due to the process, which all fall within the protection scope of the present disclosure.

The light-emitting layer group 23 can include a hole injection layer, a hole transport layer, a light-emitting layer, an electron transport layer, and an electron injection layer, that are sequentially stacked. The hole injection layer is in contact with the first electrode 211, and the electron injection layer is in contact with the second electrode 241. In some embodiments of the present disclosure, the light-emitting layer group 23 can only include a hole transport layer, a light-emitting layer, and an electron transport layer. The light-emitting layer group 23 can also have other structures, and the specific structure can be provided as needed.

In some embodiments, as shown in FIGS. 4, 5, 6, 10, 14, 18, 22 and 26, a second electrode layer 24 is arranged on a side of the light-emitting layer group 23 away from the base substrate 11. The second electrode 241 can include a low work function material layer containing Li, Ca, LiF/Ca, LiF/Al, Al, Mg, Ag, Pt, Pd, Ni, Au, Nd, Ir, Cr, BaF2, Ba, compounds thereof or mixtures thereof (such as a mixture of Ag and Mg). The second electrode 241 can also include a transparent metal oxide layer arranged on the low work function material layer.

The second electrode layer 24 in the main display area AA1 can be provided as a whole structure, that is, the second electrode layer 24 in the main display area AA1 covers the entire display panel. Patterning processing is carried out on the second electrode layer 24 in the light-transmitting display area AA2. The second electrode layer 24 in the light-transmitting display area AA2 can include multiple connection wires 242 and multiple second electrodes 241. The multiple second electrodes 241 are arranged at intervals, and the multiple second electrodes 241 and multiple first electrodes 211 are arranged in one-by-one correspondence. Multiple connection wires 242 are connected between the multiple second electrodes 241. The second electrode layer 24 can be a common electrode, and the second electrode layer 24 as a whole needs to provide a unified electrical signal, thus the multiple second electrodes 241 are connected together through the multiple connection wires 242.

In some embodiments, as shown in FIG. 4, the light-emitting layer group 23 includes multiple light-emitting parts 231 arranged at intervals. In the case where one light-emitting part 231 is provided in one first via hole 221, the second electrode layer 24 is arranged on a side where the light-emitting part 231 is away from the base substrate 11 and on a side where partial pixel definition layer 22 are away from the base substrate 11.

As shown in FIG. 5, in the case where the light-emitting layer group 23 is arranged as a whole layer, the second electrode layer 24 is arranged on a side of the light-emitting layer group 23 away from the base substrate 11.

An orthographic projection of the second electrode 241 on the base substrate 11 covers the orthographic projection of the first electrode 211 on the base substrate 11. For example, the orthographic projection of the second electrode 241 on the base substrate 11 can overlap with the orthographic projection of the first electrode 211 on the base substrate 11, or the orthographic projection of the second electrode 241 on the base substrate 11 can also cover and be larger than the orthographic projection of the first electrode 211 on the base substrate 11.

In some embodiments, the multiple connection wires 242 are parallel to each other, and both ends of the multiple connection wires 242 are connected to the second electrode layer 24 located in the main display area AA1, thereby connecting the second electrode layer 24 of the entire display panel as a whole. The multiple connection wires 242 are provided to be parallel to each other, so as to facilitate the formation of the multiple connection wires 242 through laser technology. In some embodiments, the multiple connection wires 242 can be not parallel, and the multiple connection wires 242 can be cross connected as a mesh. In some embodiments, the connection wires 242 can be provided as a curved shape, which can be aperiodic.

By carrying out the patterning processing on the second electrode layer 24 located in the light-transmitting display area AA2, that the second electrode 241 can provide electrons to the light-emitting part 231 can be ensured, while reducing an area of the second electrode layer 24 in the light-transmitting display area AA2, thereby reducing the reflection of incident ambient light, reducing the reflectivity of the light-transmitting display area AA2, and ensuring the overall-black effect.

The reflectivity of the display panel varies greatly depending on a width of the connection wire 242. Reference is made to Table 1, which illustrates the reflectivity corresponding to the connection wire 242 with a different width.

TABLE 1

| Width of the connection wire 242 | Second electrode layer 24 provided as a whole | 5 microns | 10 microns | 15 microns | 20 microns | 25 microns | 30 microns |
|---|---|---|---|---|---|---|---|
| Reflectivity | 22.5% | 12.6% | 13.5% | 14.2% | 14.9% | 15.5% | 16.1% |
| Change in the reflectivity | — | 9.9% | 9.0% | 8.2% | 7.6% | 7.0% | 6.3% |

It can be obtained from Table 1 that the narrower the width of the connection wire 242 is, the lower the reflectivity is. Conversely, the wider the width of the connection wire 242 is, the higher the reflectivity is. It can be obtained from Table 1 that the reflectivity can be reduced from 22.5% to 12.6%.

In some embodiments, the display panel can also include an encapsulation layer group 30. The encapsulation layer group 30 is arranged on a side of the second electrode layer 24 away from the base substrate 11. The encapsulation layer group 30 can be provided in multiple layers, which can include an organic layer and an inorganic layer. In some embodiments, the encapsulation layer group 30 can include a first inorganic layer, an organic layer arranged on a side of the first inorganic layer away from the base substrate 11, and a second inorganic layer arranged on a side of the organic layer away from the base substrate 11. The materials of the first inorganic layer, the organic layer, and the second inorganic layer will not be repeated here. In some embodiments, the encapsulation layer group 30 can also include more or fewer layers.

In some embodiments, as shown in FIGS. 4, 5, 6, 11, 15, 19, 23 and 27, the display panel can also include a second shielding layer 26, and the second shielding layer 26 can be located on a side of the encapsulation layer group 30 away from the base substrate 11. In some embodiments, the second shielding layer 26 can be directly arranged on a side of the second electrode 241 away from the base substrate 11. The second shielding layer 26 can also be arranged in the encapsulation layer group 30. A certain layer in the encapsulation layer group 30 can also be multiplexed as the second shielding layer 26.

The second shielding layer 26 can include multiple second shielding parts 261. The multiple second shielding parts 261 and the multiple second electrodes 241 are arranged in one-by-one correspondence. An orthographic projection of the second shielding part 261 on the base substrate 11 overlaps with an orthographic projection of the second electrode 241 on the base substrate 11, so that the second shielding part 261 can block the external incident light from irradiating the second electrode 241. Even if some of the incident light irradiates the second electrode 241 to generate reflected light, the second shielding part 261 can block the reflected light from the second electrode 241 from shooting out, reducing the reflectivity of the light-transmitting display area AA2, and ensuring the overall-black effect.

Since the second shielding part 261 needs to avoid the light-emitting part 231, the second shielding part 261 can be provided as a ring. The orthographic projection of the second shielding part 261 on the base substrate 11 is also a ring, with an inner ring line and an outer ring line. The orthographic projection of the light-emitting part 231 on the base substrate 11 can be located within the inner ring line of the orthographic projection of the second shielding part 261 on the base substrate 11. For example, an edge line of the orthographic projection of the light-emitting part 231 on the base substrate 11 can coincide with the inner ring line of the orthographic projection of the second shielding part 261 on the base substrate 11, or the edge line of the orthographic projection of the light-emitting part 231 on the base substrate 11 can be located inside the inner ring line of the orthographic projection of the second shielding part 261 on the base substrate 11, with a distance S1 between the edge line of the orthographic projection of the light-emitting part 231 on the base substrate 11 and the inner ring line of the orthographic projection of the second shielding part 261 on the base substrate 11 is greater than or equal to 2 microns and less than or equal to 6 microns, as shown in FIG. 6.

The orthographic projection of the second electrode 241 on the base substrate 11 is located within the outer ring line of the orthographic projection of the second shielding part 261 on the base substrate 11. For example, the orthographic projection of the second electrode 241 on the base substrate 11 can coincide with the outer ring line of the orthographic projection of the second shielding part 261 on the base substrate 11, or an edge line of the orthographic projection of the second electrode 241 on the base substrate 11 can be located inside the outer ring line of the orthographic projection of the second shielding part 261 on the base substrate 11.

The second shielding part 261 completely cover a portion of the second electrode 241 that does not need to transmit light, avoiding external incident light from irradiating the second electrode 241, thereby avoiding the reflection of the external incident light by the second electrode 241 and generation of the reflected light, reducing the reflectivity of the light-transmitting display area AA2, and ensuring the overall-black effect. Moreover, since only the light-emitting part 231 can emit light, the second shielding part 261 does not shield the light-emitting part 231, and the aperture ratio is ensured, thereby ensuring the light-emitting area and the brightness of each light-emitting device 20.

A width of the first shielding part 251 and the second shielding part 261 is different, resulting in significant differences in the reflectivity of the display panel. Reference is made to Table 2, which illustrates the reflectivity of the first shielding part 251 and the second shielding part 261 with a different width.

TABLE 2

| Light-transmitting display area AA2 | Width of orthographic projection of First shielding part 251/Second shielding part 261 on the base substrate | None | 2 microns | 4 microns | 6 microns |
|---|---|---|---|---|---|
| Main display area AA1 | Whether first shielding part 251 is arranged | No | No | No | Yes |
| Reflectivity of light-transmitting display area AA2 | / | 22.22% | 21.14% | 20.09% | 19.84% |
| Reflectivity of main display area AA1 | / | 7.85% | 7.85% | 7.85% | 5.88% |

It can be obtained from Table 2 that the wider the width of the orthographic projection of the first shielding part 251/the second shielding part 261 on the base substrate 11 is, the lower the reflectivity of the light-transmitting display area AA2 is. In the Table, 6 microns and 4 microns can be a width of an orthographic projection of the first shielding part 251 and the second shielding part 261 on the base substrate 11. The orthographic projection of the first shielding part 251 on the base substrate 11 partially overlaps with the orthographic projection of the second shielding part 261 on the base substrate 11. An inner portion of the orthographic projection of the second shielding part 261 overlaps with an outer portion of the orthographic projection of the first shielding part 251. Therefore, the width of the orthographic projection of the first shielding part 251 and the second shielding part 261 on the base substrate 11 refers to a distance between an outermost edge and an innermost edge of their orthographic projections.

When the main display area AA1 is provided with the first shielding part 251, the reflectivity of the main display area AA1 decreases to 5.88%.

In some embodiments, as shown in FIGS. 4, 5, 6, 11, 15, 19, 23 and 27, the second shielding layer 26 can also include a third shielding part 262. An orthographic projection of the third shielding part 262 on the base substrate 11 overlaps with the orthographic projection of the connection wire 242 on the base substrate 11, so as to block the reflected light from the connection wire 242. In some embodiments, the orthographic projection of the connection wire 242 on the base substrate 11 is located within the orthographic projection of the third shielding part 262 on the base substrate 11. For example, the orthographic projection of the connection wire 242 on the base substrate 11 can overlap with the orthographic projection of the third shielding part 262 on the base substrate 11, or the orthographic projection of the third shielding part 262 on the base substrate 11 can cover and be larger than the orthographic projection of the connection wire 242 on the base substrate 11.

The third shielding part 262 covers the connection wire 242 completely, avoiding external incident light from irradiating the second electrode 241, thereby avoiding the reflection of the external incident light by the second electrode 241 and generation of the reflected light, reducing the reflectivity of the light-transmitting display area AA2, and ensuring the overall-black effect. The reflectivity can ultimately be reduced from 12.6% to a level close to 8%.

In the light-transmitting display area AA2, the second shielding layer 26 is arranged on a side of the second electrode layer 24 away from the base substrate 11, but an area of the orthographic projection of the second shielding layer 26 on the base substrate 11 is far less than an area of an orthographic projection of a black matrix on the base substrate 11, the black matrix being arranged on a color film layer 40 in the existing display panel. Therefore, the reflectivity can be greatly reduced at the expense of less transmittance by providing the second shielding layer 26.

Figure 7:
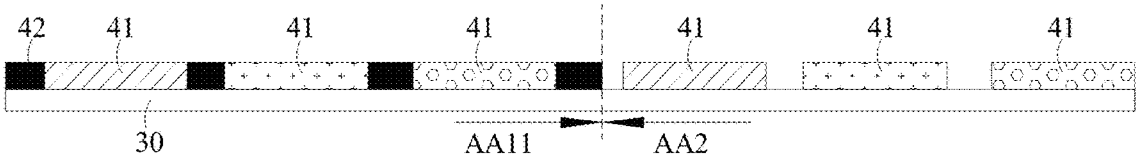
FIG. 7 is a schematic structural diagram of a color film layer in FIGS. 4 to 5.
Figure 8:
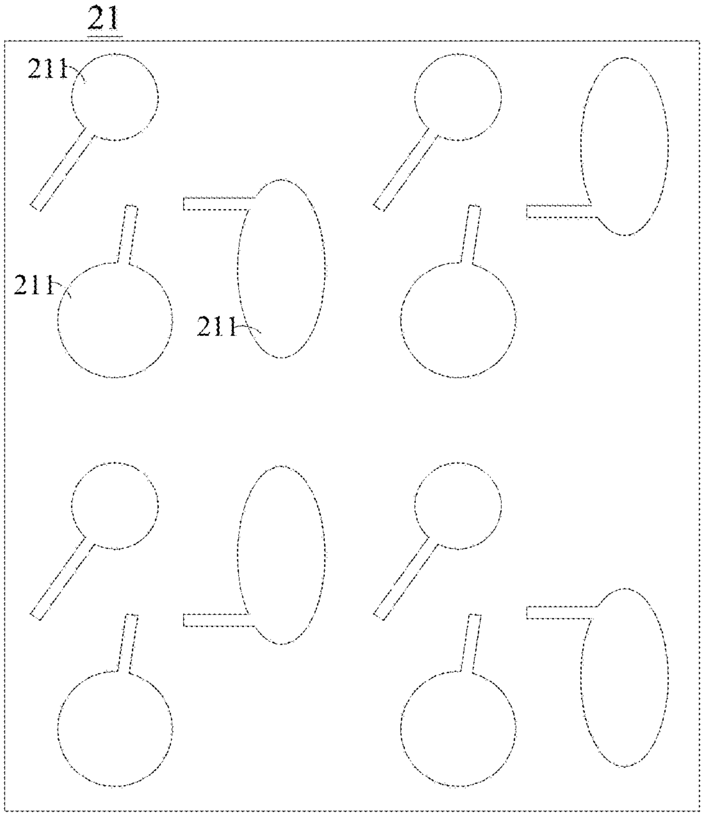
FIG. 8 is a schematic structural diagram of a first exemplary implementation of a first electrode arrangement of a display panel according to embodiments of the present disclosure.
Figure 9:
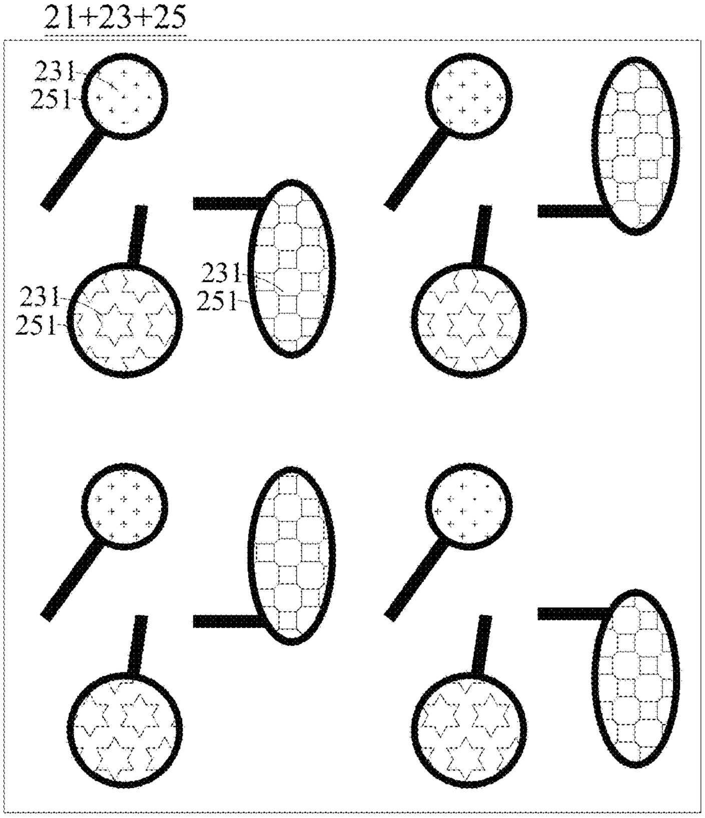
FIG. 9 is a schematic structural diagram of a light-emitting layer and a first shielding layer formed on the basis of FIG. 8.
Figure 10:
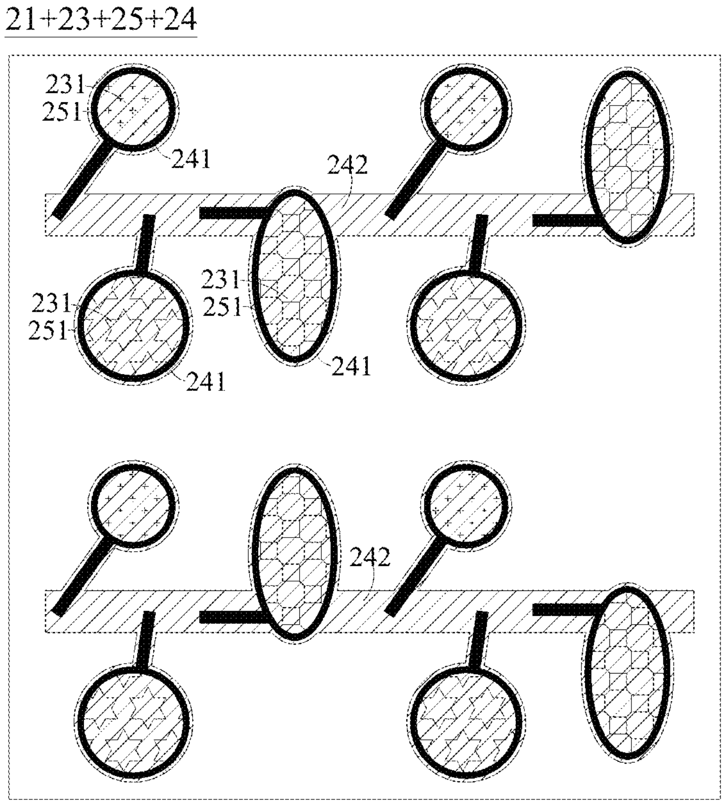
FIG. 10 is a schematic structural diagram of a second electrode layer formed on the basis of FIG. 9.

In some embodiments, the display panel can also include a color film layer 40, which can be arranged on a side of the encapsulation layer group 30 away from the base substrate 11. As shown in FIG. 7, in order to improve the transmittance of the light-transmitting display area AA2, the color film layer 40 in the light-transmitting display area AA2 can include multiple light-transmitting parts 41 of different colors. That is, the color film layer 40 in the light-transmitting display area AA2 does not include the black matrix (a shading part 42), and it is completely light-transmitting portion at a position where the black matrix (shading part 42) is originally provided. Alternatively, an area of each light-transmitting part 41 is enlarged to connect adjacent two light-transmitting parts 41. The color film layer 40 in the main display area AA1 can include multiple light-transmitting parts 41 of different colors and shading parts 42 arranged between adjacent two light-transmitting parts 41. The shading parts 42 are connected as a whole to form the black matrix.

In some embodiments, the color film layer 40 can be arranged on a side of the encapsulation layer group 30 close to the base substrate 11. That is, the color film layer 40 can be arranged between the encapsulation layer group 30 and the second electrode layer 24, so as to allow the color film layer 40 to be closer to the light-emitting layer group. Such arrangement can optimize a perspective of the display panel. In some embodiments, the encapsulation layer group 30 can be provided as a multi-layer structure. The specific structure of the encapsulation layer group 30 has been explained in detail above, which will not be repeated here. The color film layer 40 can be arranged inside the encapsulation layer group 30. For example, the color film layer 40 can be arranged between the first inorganic layer and the organic layer, or between the organic layer and the second inorganic layer.

In some embodiments, the display panel can also include an anti-reflectance film 50 (AR film for short), and the anti-reflectance film 50 is arranged on a side of the color film layer 40 away from the base substrate 11. In some embodiments, the anti-reflectance film 50 can also be arranged on a side of a cover plate away from the base substrate 11. The anti-reflectance film 50 can include a film stack formed by low refractive index and high refractive index materials alternately, and the interference effect can be used to reduce the reflectivity of the display panel and increase the transmittance of the display panel, so as to allow the reflectivity of the light-transmitting display area AA2 to be basically consistent with the reflectivity of the main display area AA1.

An arrangement of the light-emitting device 20 is exemplified in the following.

Figure 11:
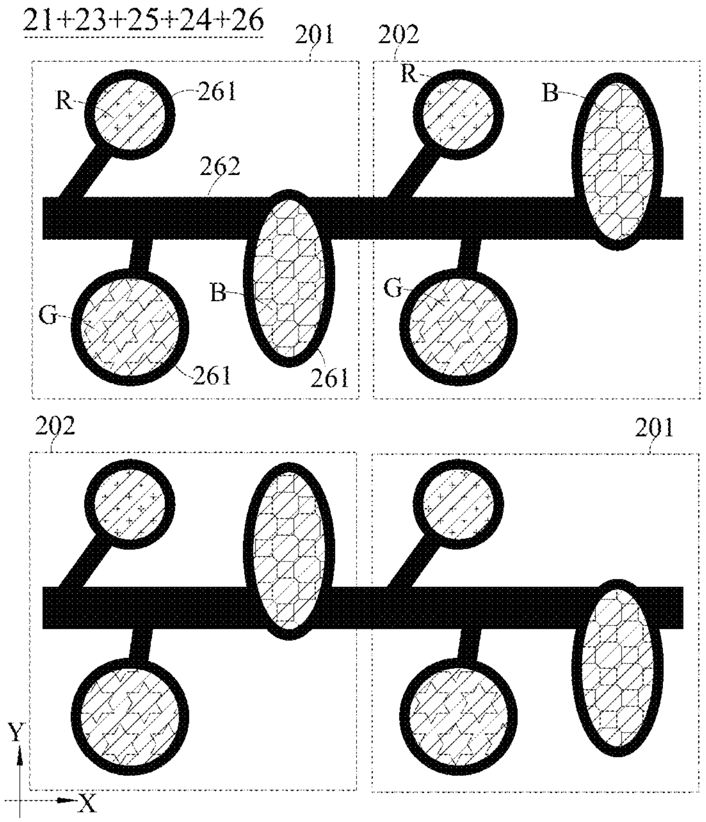
FIG. 11 is a schematic structural diagram of a second shielding layer formed on the basis of FIG. 10.
Figure 12:
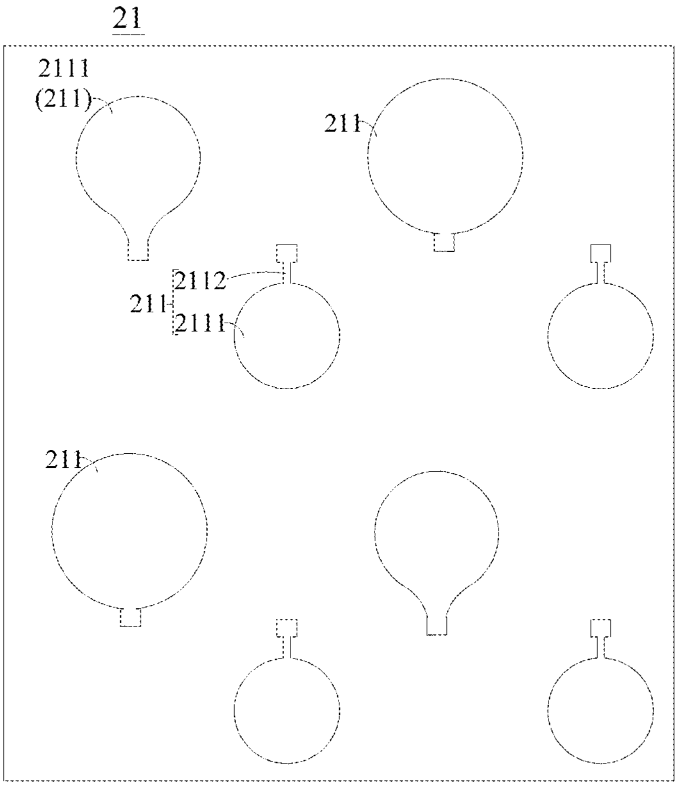
FIGS. 12-15 are schematic structural diagrams of a second exemplary implementation of a first electrode arrangement of a display panel, as well as steps of sequentially forming a light-emitting layer, a first shielding layer, a second electrode layer, and a second shielding layer according to embodiments of the present disclosure.
Figure 13:
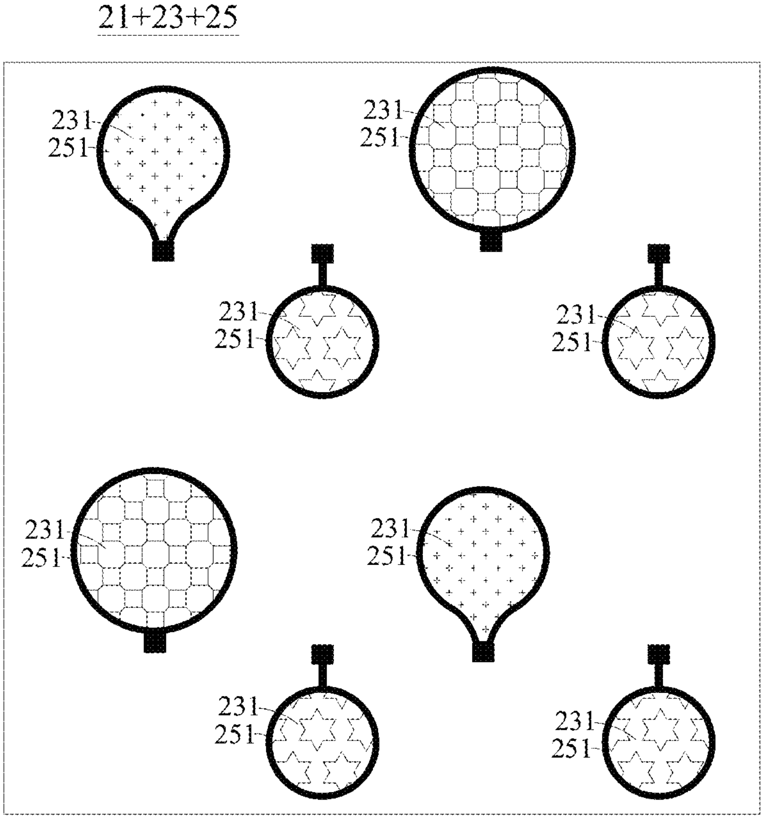
Figure 14:
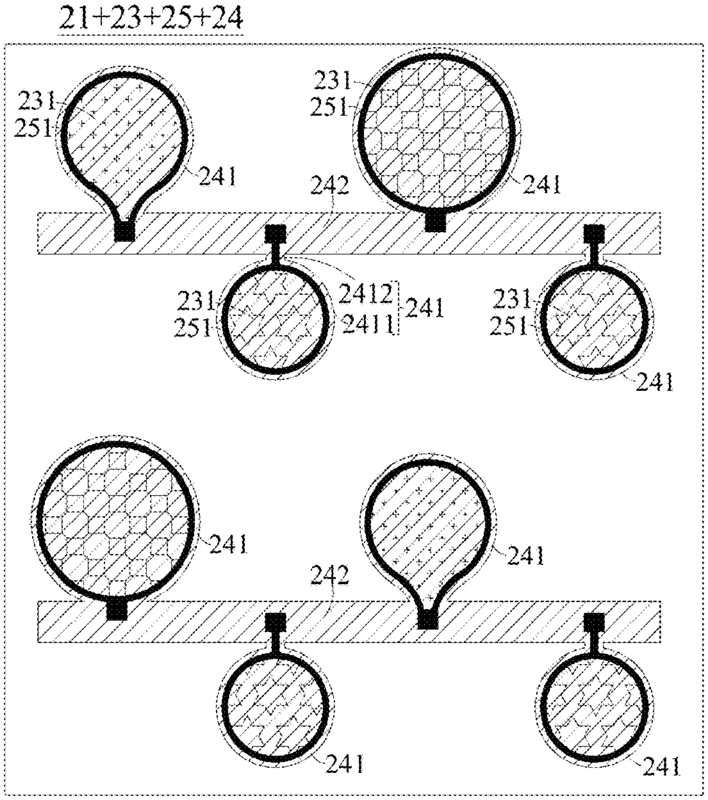
Figure 15:
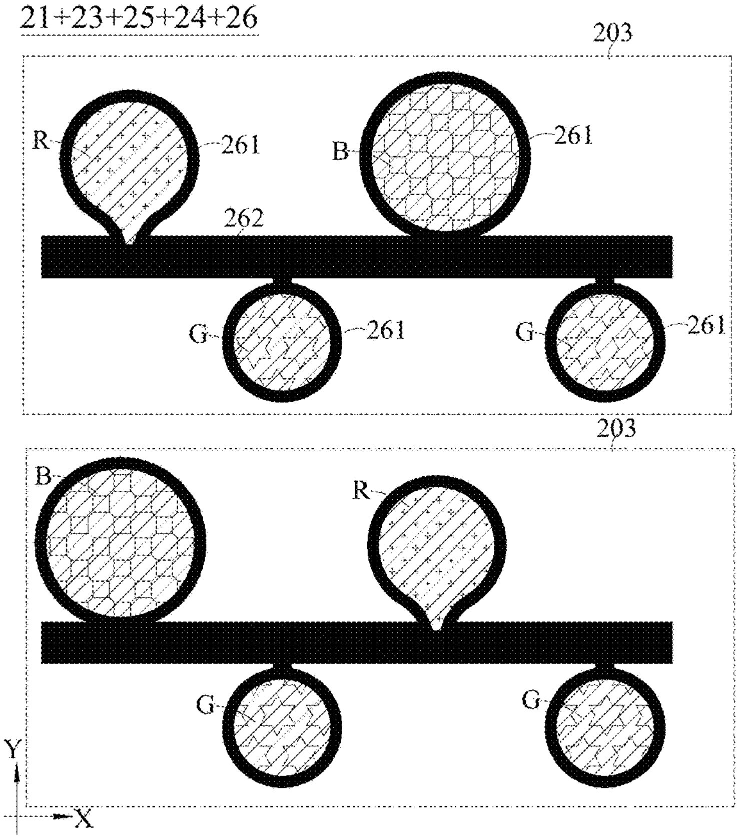
Figure 16:
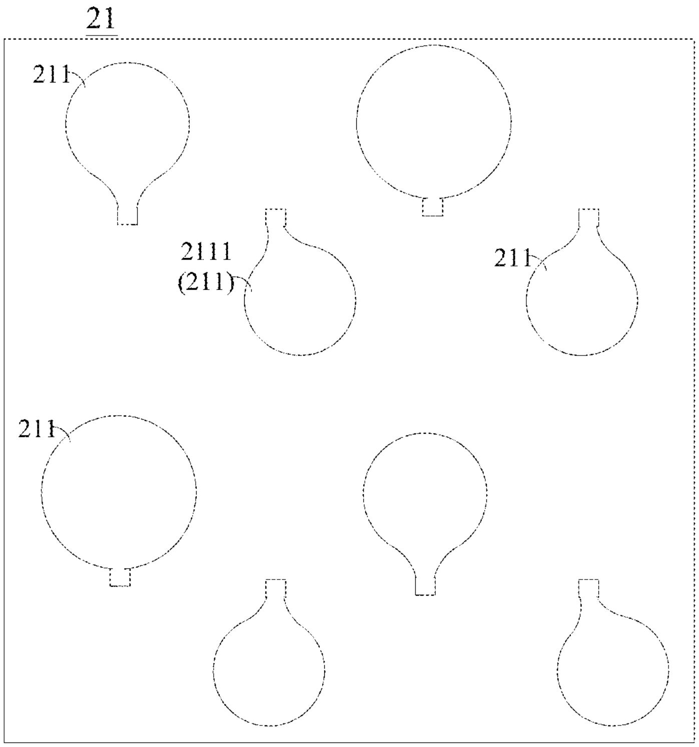
FIGS. 16-19 are schematic structural diagrams of a third exemplary implementation of a first electrode arrangement of a display panel, as well as steps of sequentially forming a light-emitting layer, a first shielding layer, a second electrode layer, and a second shielding layer according to embodiments of the present disclosure.
Figure 17:
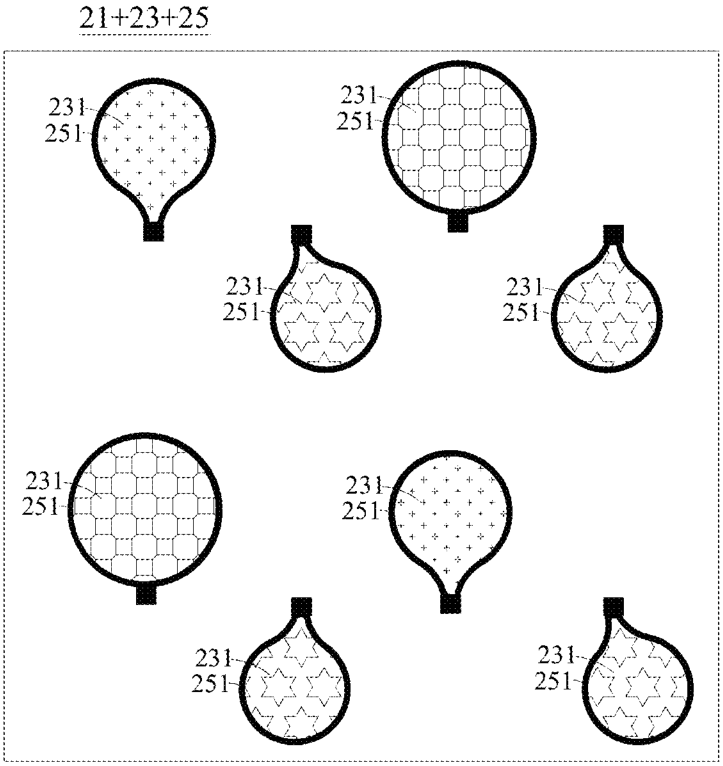
Figure 18:
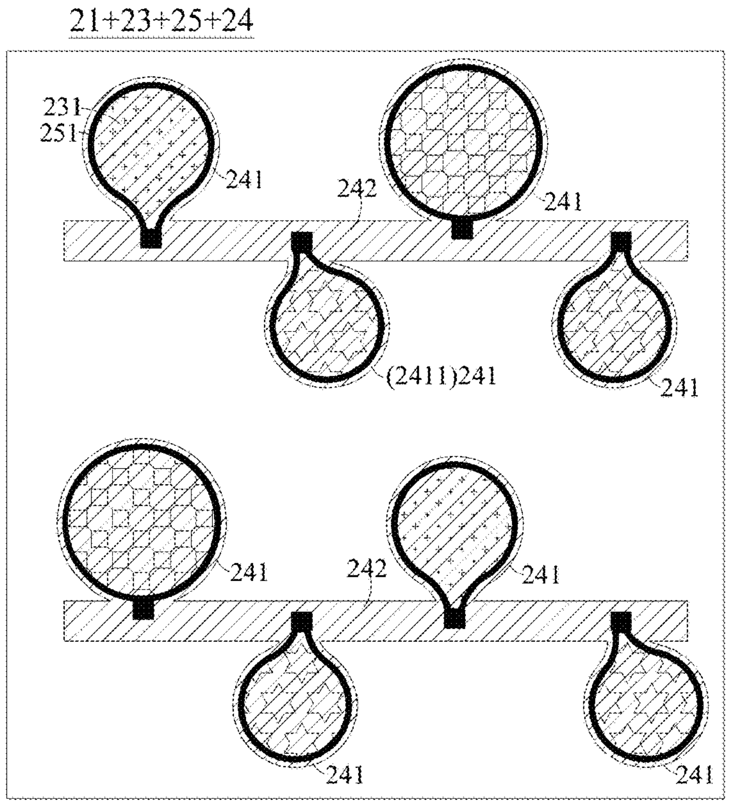
Figure 19:
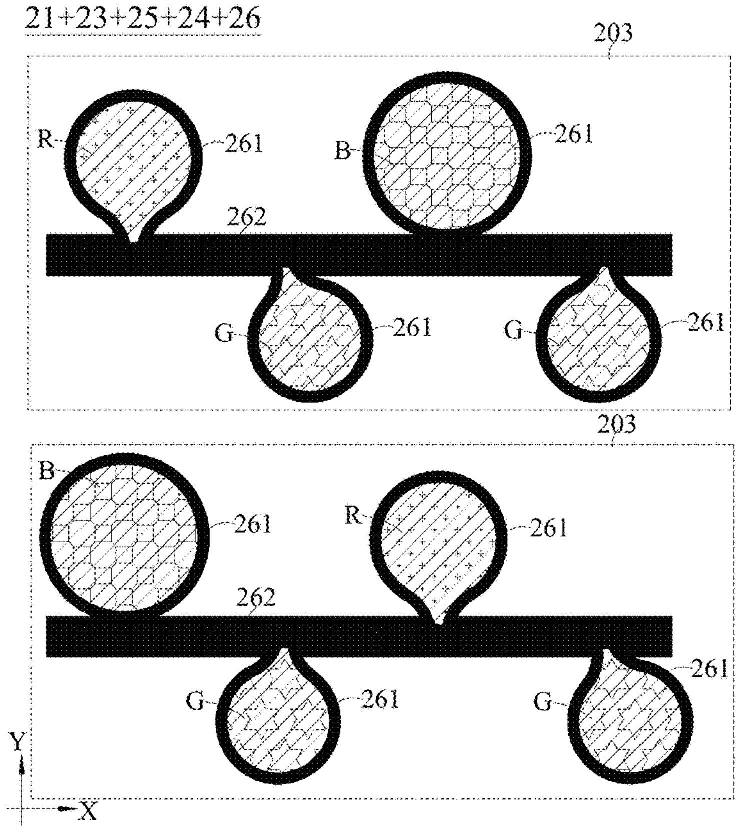
Figure 20:
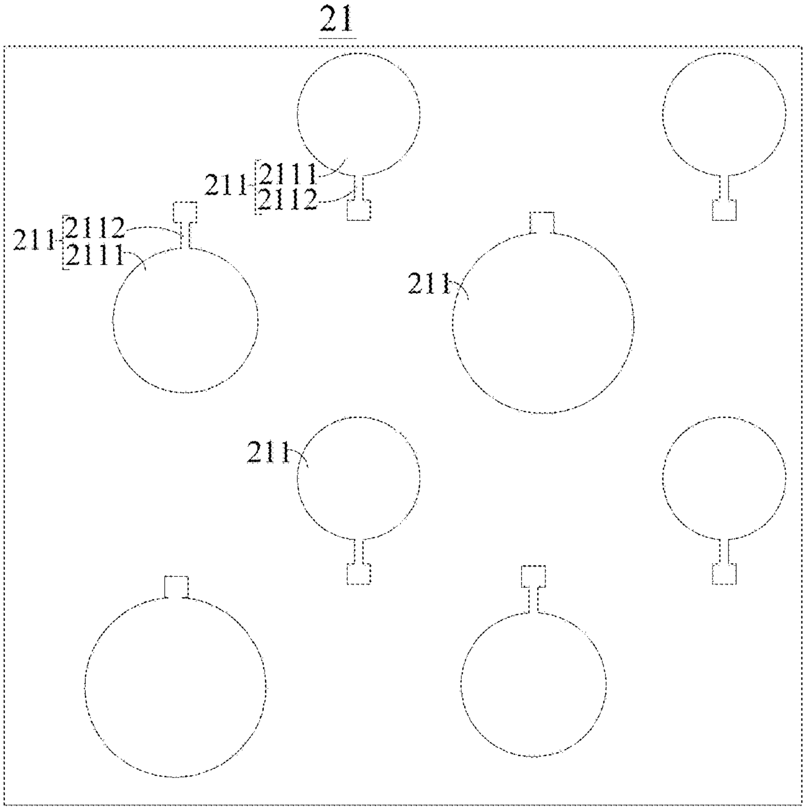
FIGS. 20-23 are schematic structural diagrams of a fourth exemplary implementation of a first electrode arrangement of a display panel, as well as steps of sequentially forming a light-emitting layer, a first shielding layer, a second electrode layer, and a second shielding layer according to embodiments of the present disclosure.
Figure 21:
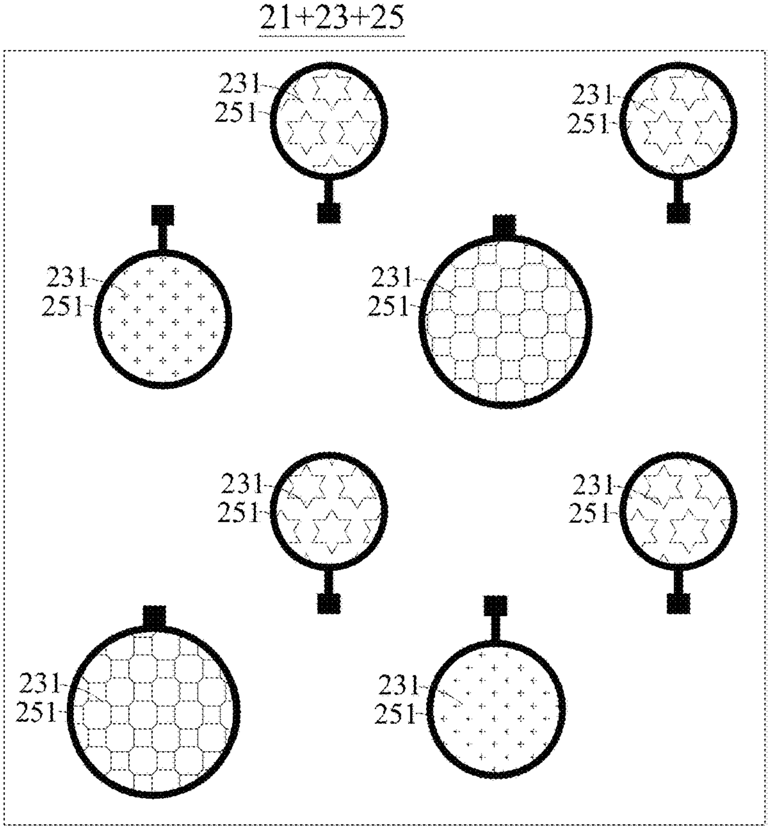
Figure 22:
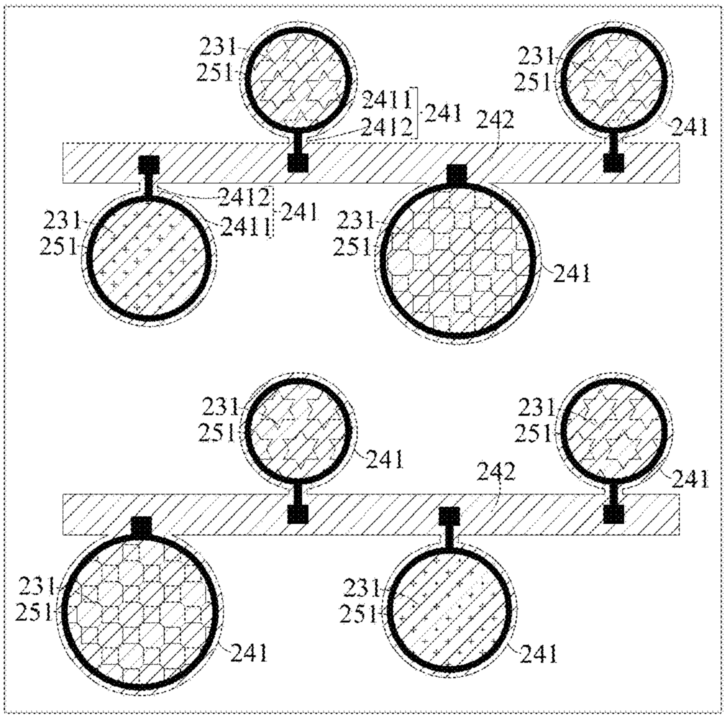
Figure 23:
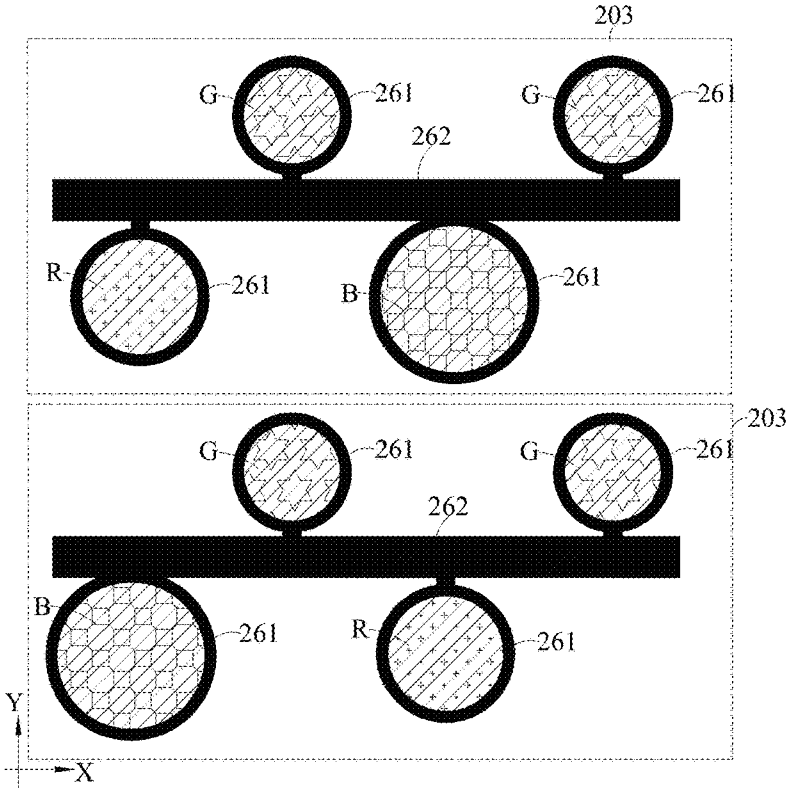
Figure 24:
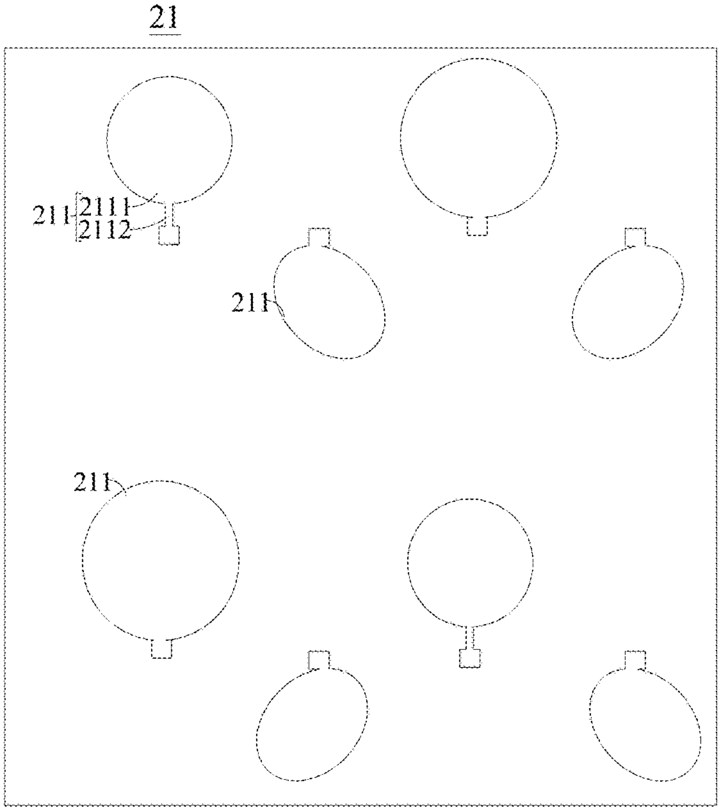
FIGS. 24-27 are schematic structural diagrams of a fifth exemplary implementation of a first electrode arrangement of a display panel, as well as steps of sequentially forming a light-emitting layer, a first shielding layer, a second electrode layer, and a second shielding layer according to embodiments of the present disclosure.
Figure 25:
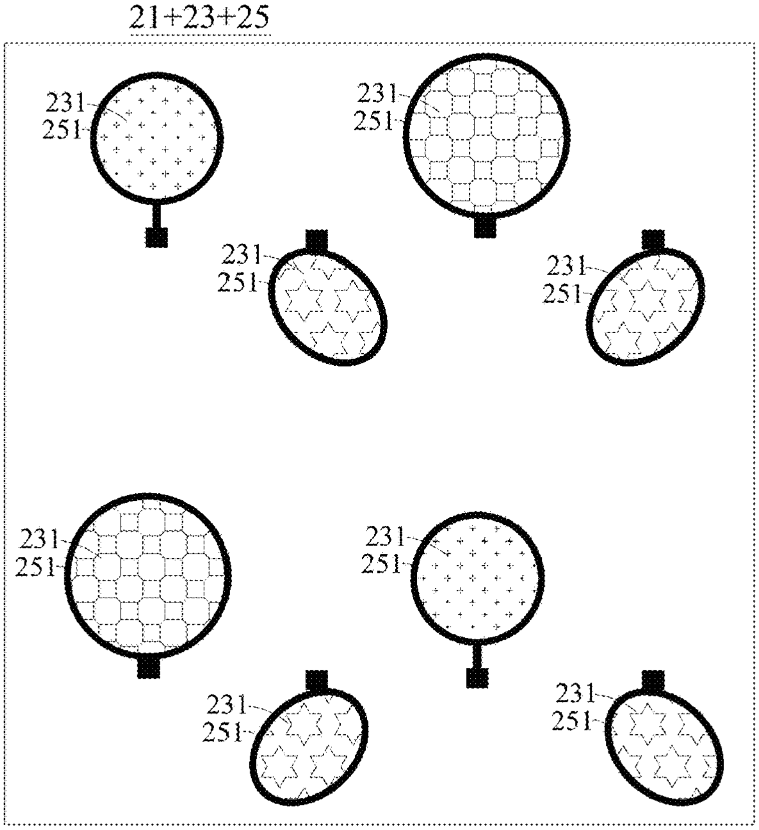
Figure 26:
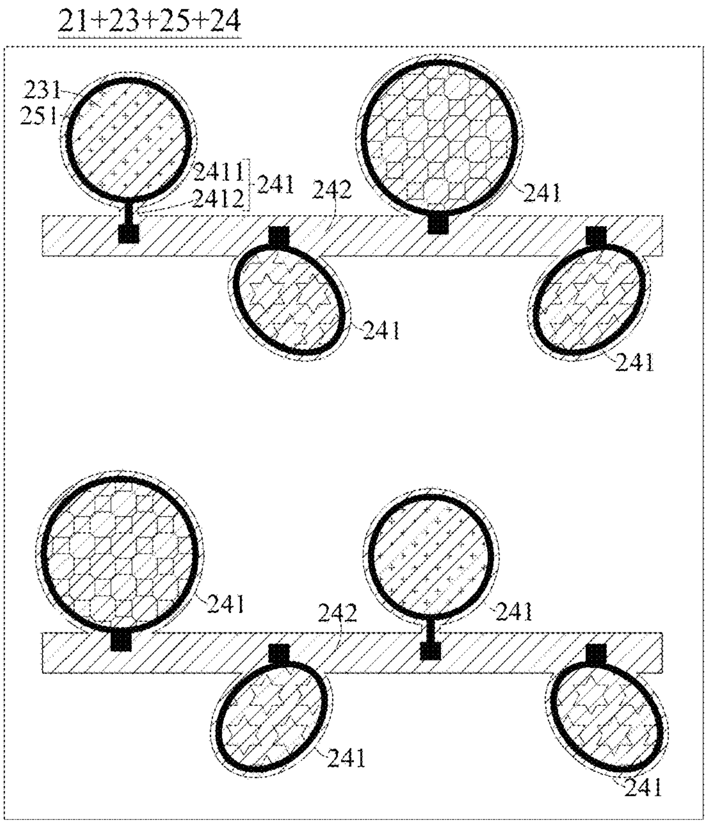
Figure 27:
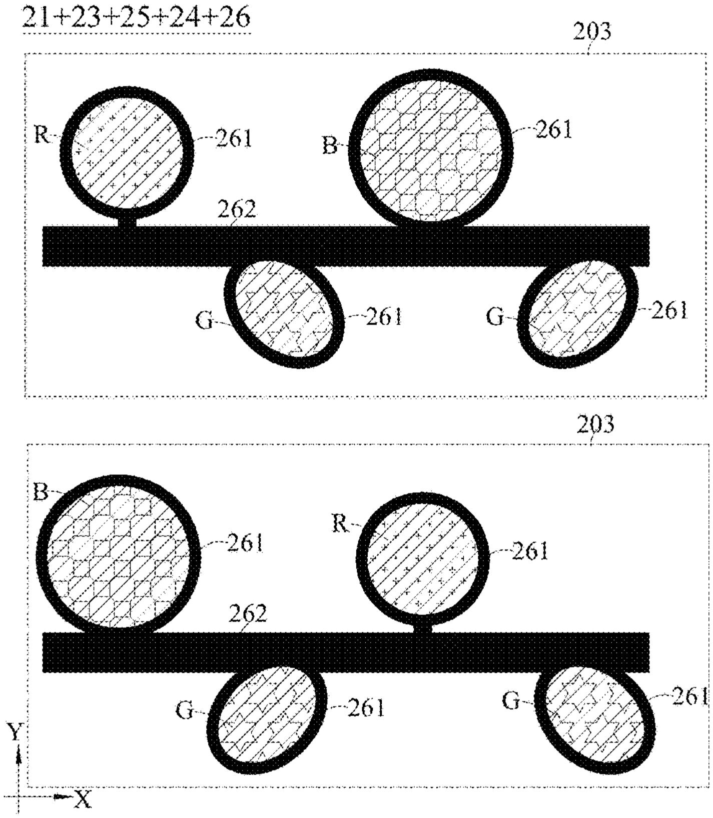

One light-emitting device 20 can include one first electrode 211, one light-emitting part 231 and one second electrode 241. The light-transmitting display area AA2 is provided with multiple light-emitting devices 20. The multiple light-emitting devices 20 can include a first light-emitting device G, a second light-emitting device R, and a third light-emitting device B. As shown in FIG. 11, one first light-emitting device G, one second light-emitting device R and one third light-emitting device B form one light-emitting unit 203, and multiple light-emitting units 203 are arranged in an array. The second light-emitting device R and the first light-emitting device G are provided as a circular shape, and the third light-emitting device B is provided as an elliptical shape.

The multiple light-emitting units 203 can include multiple first light-emitting units 201 and multiple second light-emitting units 202. The multiple first light-emitting units 201 and the multiple second light-emitting units 202 are arranged alternately along the first direction X. For example, two first light-emitting units 201 and two second light-emitting units 202 are sequentially arranged along the first direction X as the first light-emitting unit 201, the second light-emitting unit 202, the first light-emitting unit 201, and the second light-emitting unit 202. As a result, there is one second light-emitting unit 202 between two adjacent first light-emitting units 201, and there is one first light-emitting unit 201 between two adjacent second light-emitting units 202. The multiple first light-emitting units 201 and the multiple second light-emitting units 202 are also arranged alternately along the second direction Y. For example, two first light-emitting units 201 and two second light-emitting units 202 are sequentially arranged along the second direction Y as the first light-emitting unit 201, the second light-emitting unit 202, the first light-emitting unit 201, and the second light-emitting unit 202. As a result, there is one second light-emitting unit 202 between two adjacent first light-emitting units 201, and there is one first light-emitting unit 201 between two adjacent second light-emitting units 202.

The second light-emitting device R and the first light-emitting device G in the first light-emitting unit 201 are arranged on opposite sides of the connection wire 242, and a center of the second light-emitting device R and a center of the first light-emitting device G are located on the same straight line. The third light-emitting device B and the first light-emitting device G are arranged on the same side of the connection wire 242, and the third light-emitting device B overlaps with the connection wire 242, so that the connection wire 242 is disconnected at the third light-emitting device B. The disconnected connection wire 242 is connected through the second electrode 241 of the third light-emitting device B.

The second light-emitting device R and the first light-emitting device G in the second light-emitting unit 202 are arranged on opposite sides of the connection wire 242, and the center of the second light-emitting device R and the center of the first light-emitting device G are located on the same straight line. The third light-emitting device B and the second light-emitting device R are arranged on the same side of the connection wire 242, and the third light-emitting device B overlaps with the connection wire 242, so that the connection wire 242 is disconnected at the third light-emitting device B. The disconnected connection wire 242 is connected through the second electrode 241 of the third light-emitting device B.

The second light-emitting device R in the first light-emitting unit 201 and the second light-emitting device R in the second light-emitting unit 202 are arranged on the same side of the connection wire 242, and the first light-emitting device G in the first light-emitting unit 201 and the first light-emitting device G in the second light-emitting unit 202 are arranged on the same side of the connection wire 242.

As shown in FIGS. 15, 19, 23 and 27, the light-emitting unit 203 can include two first light-emitting devices G, one second light-emitting device R and one third light-emitting device B. Multiple light-emitting units 203 are sequentially arranged along the first direction X, and multiple light-emitting units 203 are staggeredly arranged along the second direction Y.

The two first light-emitting devices G are located on the same side of the connection wire 242, and the second light-emitting device R and the third light-emitting device B are located on a side of the connection wire 242 away from the first light-emitting device G. The second light-emitting device R is located between two adjacent first light-emitting devices G, and the third light-emitting device B is located between two adjacent first light-emitting devices G.

The multiple light-emitting units 203 are staggeredly arranged along the second direction Y, so that multiple second light-emitting devices R and multiple third light-emitting devices B are alternately arranged along the second direction Y to form a column. That is, there is one third light-emitting device B arranged between two adjacent second light-emitting devices R, and there is one second light-emitting device R arranged between two adjacent third light-emitting devices B. Multiple first light-emitting devices G are arranged in a column.

As shown in FIGS. 12-15, the first light-emitting device G is provided as a circular shape, the second light-emitting device R is provided as a water-drop shape, and the third light-emitting device B is provided as a circular shape.

As shown in FIGS. 16-19, the first light-emitting device G is provided as a water-drop shape, the second light-emitting device R is provided as a water-drop shape, and the third light-emitting device B is provided as a circular shape.

As shown in FIGS. 20-23, the first light-emitting device G is provided as a circular shape, the second light-emitting device R is provided as a circular shape, and the third light-emitting device B is provided as a circular shape.

As shown in FIGS. 24-27, the first light-emitting device G is provided as an elliptical shape, the second light-emitting device R is provided as a circular shape, and the third light-emitting device B is provided as a circular shape.

Since an area of the third light-emitting device B is greater than an area of the first light-emitting device G and an area of the second light-emitting device R, the first electrode 211 and the second electrode 241 of the third light-emitting device B need not be provided with electrode connection lines. While the area of the first light-emitting device G and the area of the second light-emitting device R are small, and considering that a light-emitting center cannot be offset, a first electrode connection line 2112 and a second electrode connection line 2412 need to be provided.

In some embodiments, in the case where the first light-emitting device G and the second light-emitting device R are provided as a circular shape, the first electrode 211 of the first light-emitting device G and the first electrode 211 of the second light-emitting device R can include a first electrode body 2111 and a first electrode connection line 2112. One end of the first electrode connection line 2112 is connected to the first electrode body 2111, and the other end of the first electrode connection line 2112 is connected to a transparent wire 61 and connected to the pixel circuit. In some embodiments, the second electrode 241 of the first light-emitting device G and the second electrode 241 of the second light-emitting device R can include a second electrode body 2411 and a second electrode connection line 2412. One end of the second electrode connection line 2412 is connected to the second electrode body 2411, and the other end of the second electrode connection line 2412 is connected to a wire. The first electrode body 2111 and the second electrode body 2411 are both provided as a circular shape.

The finer fabrication of the first electrode connection line 2112 and the second electrode connection line 2412 will result in diffraction, affecting the display effect and the imaging effect of the camera.

In the case where the first light-emitting device G and the second light-emitting device R are provided as a water-drop shape or an elliptical shape, the first electrode 211 of the first light-emitting device G and the first electrode 211 of the second light-emitting device R include the first electrode body 2111, and the second electrode 241 of the first light-emitting device G and the second electrode 241 of the second light-emitting device R include the second electrode body 2411. The first electrode body 2111 is provided as a water-drop shape or an elliptical shape, and the second electrode body 2411 is provided as a water-drop shape or an elliptical shape. There is no need to provide the first electrode connection line 2112 and the second electrode connection line 2412, thus reducing or even avoiding the diffraction, and ensuring the display effect and the imaging effect.

The first light-emitting device G is a green light-emitting device, the second light-emitting device R is a red light-emitting device, and the third light-emitting device B is a blue light-emitting device. In some embodiments, the first light-emitting device G can also be a red light-emitting device or a blue light-emitting device, the second light-emitting device R can also be a green light-emitting device or a blue light-emitting device, and the third light-emitting device B can also be a green light-emitting device or a red light-emitting device.

In some embodiments, an orthographic projection of the first via hole 221 on the base substrate 11 is located within an orthographic projection of the second electrode body 2411 on the base substrate 11, and an orthographic projection of the second electrode connection line 2412 on the base substrate 11 does not overlap with the orthographic projection of the first via hole 221 on the base substrate 11, so as to avoid the second electrode connection line 2412 connected with the second electrode 241 extending into the first via hole 221, bending and breaking on the wall of the first via hole 221, affecting the display effect.

The connection wire 242 extends along the first direction X, and multiple light-emitting units 203 sequentially arranged along the first direction X are connected to the same connection wire 242.

Figure 28:
FIG. 28 is a schematic structural diagram of an exemplary implementation of a display device according to embodiments of the present disclosure.

Based on the same inventive concept, embodiments of the present disclosure provide a display device, as shown in FIG. 28. The display device can include a display panel 400 as described in any of above embodiments and a photosensitive sensor 300. The specific structure of the display panel 400 has been explained in detail above, which will not be repeated here.

The photosensitive sensor 300 is arranged on a non-display surface of the display panel 400, and an orthographic projection of the photosensitive sensor 300 on a display surface at least partially overlaps with the light-transmitting display area AA2. For example, the orthographic projection of the photosensitive sensor 300 on the display surface can overlap with the light-transmitting display area AA2, the orthographic projection of the photosensitive sensor 300 on the display surface can be located within the light-transmitting display area AA2, and so on.

The specific type of display device is not limited by special restrictions, and any type of the display device commonly used in the art is acceptable. For example, mobile devices such as mobile phones, wearable devices such as watches, VR devices, etc. Those skilled in the art can make corresponding choices based on the specific purpose of the display device, which will not be repeated here.

It should be noted that in addition to the display panel, the display device also includes other necessary parts and components. The display is taken as an example, a shell, a circuit board, a power cord, etc., for example. Those skilled in the art can supplement accordingly according to the specific usage requirements of the display device, which will not repeat it here.

Compared with the prior art, the beneficial effects of the display device provided by embodiments of the present disclosure are the same as those of the display panel provided by aforementioned embodiments, which will not be elaborated here.

After considering the specification and practices of the present disclosure, those skilled in the art will easily come up with other implementation solutions of the present disclosure. The present disclosure aims to cover any variations, uses, or adaptive changes of the present disclosure, which follow the general principles of the present disclosure and include common knowledge or technical means commonly used in the art that are not disclosed in the present disclosure. The specification and embodiments are only considered exemplary, and the true scope and spirit of the present disclosure are defined by appended claims.

What is claimed is:

1. A display panel having a main display area and a light-transmitting display area arranged adjacently, wherein the display panel comprises:

a base substrate;

a first electrode layer arranged on a side of the base substrate, wherein the first electrode layer comprises multiple first electrodes arranged at intervals;

a pixel definition layer arranged on a side of the first electrode layer away from the base substrate, wherein the pixel definition layer is provided with multiple first via holes, and the multiple first via holes are connected to the multiple first electrodes in correspondence;

a light-emitting layer group at least partially arranged within the first via holes, wherein the light-emitting layer group located within the first via holes forms light-emitting parts; and a second electrode layer arranged on a side of the light-emitting layer group away from the base substrate, wherein in the light-transmitting display area, the second electrode layer comprises:

multiple second electrodes arranged at intervals, wherein the second electrodes are located on a side of the light-emitting parts away from the base substrate, orthographic projections of the second electrodes on the base substrate cover orthographic projections of the first electrodes on the base substrate; and multiple connection wires connected between the multiple second electrodes;

wherein in the light-transmitting display area, the display panel further comprises:

a first shielding layer arranged on a side of the second electrode layer away from the base substrate, wherein the first shielding layer comprises multiple second shielding parts corresponding to the multiple second electrodes, and orthographic projections of the second shielding parts on the base substrate overlap with the orthographic projections of the second electrodes on the base substrate, to block reflected light from the second electrodes.

2. The display panel according to claim 1, wherein the multiple connection wires are parallel to each other.

3. The display panel according to claim 1, wherein walls of the first via holes are provided in an inclined manner, to increase cross-sectional areas of sections of the first via holes parallel to a first direction as a distance to the base substrate increases along a third direction, and inclination angles of the walls are greater than or equal to 5° and less than or equal to 50°, and wherein the first direction is parallel to a surface of the base substrate close to the first electrode layer, and the third direction is perpendicular to the surface of the base substrate close to the first electrode layer.

4. The display panel according to claim 1, wherein in the light-transmitting display area, the display panel further comprises:

a second shielding layer arranged on a side of the first electrode layer away from the base substrate, wherein the second shielding layer comprises multiple first shielding parts corresponding to the multiple first electrodes, orthographic projections of the first shielding parts on the base substrate overlap with the orthographic projections of the first electrodes on the base substrate, to block reflected light from the first electrodes.

5. The display panel according to claim 4, wherein the pixel definition layer comprises multiple pixel definition parts arranged at intervals, the multiple pixel definition parts and the multiple first electrodes are arranged in correspondence, and the pixel definition parts are located on a side of the first electrodes away from the base substrate, and wherein the pixel definition layer is multiplexed as the second shielding layer, and the pixel definition parts are multiplexed as the first shielding parts.

6. The display panel according to claim 5, wherein the pixel definition parts are provided as a ring shape, and orthographic projections of outer ring surfaces of the pixel definition parts on the base substrate overlap with edge lines of the orthographic projections of the first electrodes on the base substrate.

7. The display panel according to claim 4, wherein the second shielding layer is arranged on a side of the pixel definition layer away from the base substrate, or the second shielding layer is arranged between the pixel definition layer and the first electrode layer.

8. The display panel according to claim 7, wherein the first shielding parts are provided as a ring shape, orthographic projections of inner ring surfaces of the first shielding parts on the base substrate are located within orthographic projections of walls of the first via holes on the base substrate, and orthographic projections of outer ring surfaces of the first shielding parts on the base substrate overlap with edge lines of the orthographic projections of the first electrodes on the substrate.

9. The display panel according to claim 1, wherein the second shielding parts are provided as a ring shape, orthographic projections of the light-emitting parts on the base substrate are located within inner ring lines of the orthographic projections of the second shielding parts on the base substrate, and the orthographic projections of the second electrodes on the base substrate are located within outer ring lines of the orthographic projections of the second shielding parts on the base substrate.

10. The display panel according to claim 1, wherein the first shielding layer further comprises a third shielding part, wherein an orthographic projection of the third shielding part on the base substrate overlaps with orthographic projections of the connection wires on the base substrate, to block reflected light from the connection wires.

11. The display panel according to claim 10, wherein the orthographic projections of the connection wires on the base substrate are located within the orthographic projection of the third shielding part on the base substrate.

12. The display panel according to claim 1, further comprising an encapsulation layer group arranged on a side of the second electrode layer away from the base substrate, wherein the first shielding layer is arranged on a side of the encapsulation layer group away from the base substrate.

13. The display panel according to claim 12, further comprising a color film layer arranged on the side of the encapsulation layer group away from the base substrate, wherein the color film layer comprises, in the light-transmitting display area, multiple light-transmitting parts of different colors, and comprises, in the main display area, multiple light-transmitting parts of different colors and a shading part arranged between adjacent two light-transmitting parts.

14. The display panel according to claim 13, further comprising an anti-reflectance film arranged on a side of the color film layer away from the base substrate.

15. The display panel according to claim 1, wherein in the light-transmitting display area, the display panel further comprises:

a light blocking layer arranged between the first electrode layer and the base substrate, wherein the light blocking layer comprises multiple light blocking parts, and the orthographic projections of the first electrodes on the base substrate are located within orthographic projections of the light blocking parts on the base substrate.

16. The display panel according to claim 15, wherein the orthographic projections of the light blocking parts on the base substrate coincide with the orthographic projections of the second electrodes on the base substrate.

17. The display panel according to claim 1, wherein the light-transmitting display area is provided with multiple light-emitting devices, each light-emitting device comprises one first electrode, one light-emitting part and one second electrode, the multiple light-emitting devices comprise multiple first light-emitting devices, multiple second light-emitting devices and multiple third light-emitting devices, the multiple light-emitting devices form multiple light-emitting units, and each light-emitting unit comprises one first light-emitting device, one second light-emitting device and one third light-emitting device; and wherein the multiple light-emitting units comprise multiple first light-emitting units and multiple second light-emitting units, the multiple first light-emitting units and the multiple second light-emitting units are alternately arranged along a first direction, and the multiple first light-emitting units and the multiple second light-emitting units are alternately arranged along a second direction, and wherein the first direction and the second direction are parallel to a surface of the base substrate close to the first electrode layer, and the first direction intersects with the second direction.

18. The display panel according to claim 1, wherein the light-transmitting display area is provided with multiple light-emitting devices, each light-emitting device comprises one first electrode, one light-emitting part and one second electrode, the multiple light-emitting devices comprise multiple first light-emitting devices, multiple second light-emitting devices and multiple third light-emitting devices, the multiple light-emitting devices form multiple light-emitting units, and each light-emitting unit comprises two first light-emitting devices, one second light-emitting device and one third light-emitting device; and wherein the multiple light-emitting units are sequentially arranged along a first direction, and the multiple light-emitting units are staggeredly arranged along a second direction, and wherein the first direction and the second direction are parallel to a surface of the base substrate close to the first electrode layer, and the first direction intersects with the second direction.

19. A display device, comprising:

a display panel, wherein display panel has a main display area and a light-transmitting display area arranged adjacently, and the display panel comprises:

a base substrate;

a first electrode layer arranged on a side of the base substrate, wherein the first electrode layer comprises multiple first electrodes arranged at intervals;

a pixel definition layer arranged on a side of the first electrode layer away from the base substrate, wherein the pixel definition layer is provided with multiple first via holes, and the multiple first via holes are connected to the multiple first electrodes in correspondence;

a light-emitting layer group at least partially arranged within the first via holes, wherein the light-emitting layer group located within the first via holes forms light-emitting parts; and a second electrode layer arranged on a side of the light-emitting layer group away from the base substrate, wherein in the light-transmitting display area, the second electrode layer comprises:

multiple second electrodes arranged at intervals, wherein the second electrodes are located on a side of the light-emitting parts away from the base substrate, orthographic projections of the second electrodes on the base substrate cover orthographic projections of the first electrodes on the base substrate; and multiple connection wires connected between the multiple second electrodes;

wherein in the light-transmitting display area, the display panel further comprises:

a first shielding layer arranged on a side of the second electrode layer away from the base substrate, wherein the first shielding layer comprises multiple second shielding parts corresponding to the multiple second electrodes, and orthographic projections of the second shielding parts on the base substrate overlap with the orthographic projections of the second electrodes on the base substrate, to block reflected light from the second electrodes; and a photosensitive sensor arranged on a non-display surface of the display panel, wherein an orthographic projection of the photosensitive sensor on a display surface at least partially overlaps with the light-transmitting display area.

20. The display panel according to claim 18, wherein the two first light-emitting devices are located on a same side of the connection wire, the second light-emitting device and the third light-emitting device are located on a side of the connection wire away from the first light-emitting device, the second light-emitting device is located between two adjacent first light-emitting devices, and the third light-emitting device is located between two adjacent first light-emitting devices.

* * * * *